(12) United States Patent
Miyashita et al.

(10) Patent No.: US 11,901,166 B2
(45) Date of Patent: Feb. 13, 2024

(54) MAGNETRON SPUTTERING APPARATUS AND MAGNETRON SPUTTERING METHOD

(71) Applicant: TOKYO ELECTRON LIMITED, Tokyo (JP)

(72) Inventors: Tetsuya Miyashita, Yamanashi (JP); Kanto Nakamura, Yamanashi (JP); Yusuke Kikuchi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/490,574

(22) Filed: Sep. 30, 2021

(65) Prior Publication Data

US 2022/0108880 A1   Apr. 7, 2022

(30) Foreign Application Priority Data

Oct. 6, 2020   (JP) .................. 2020-169360

(51) Int. Cl.
*H01J 37/34* (2006.01)
*H01J 37/32* (2006.01)
*C23C 14/34* (2006.01)

(52) U.S. Cl.
CPC ...... *H01J 37/3405* (2013.01); *C23C 14/3407* (2013.01); *H01J 37/3244* (2013.01); *H01J 37/3455* (2013.01)

(58) Field of Classification Search
CPC .............. H01J 37/3405; H01J 37/3244; H01J 37/3455; H01J 37/3464; C23C 14/3407; C23C 14/165; C23C 14/352; C23C 14/54; C23C 14/35

USPC ............... 204/298.2, 298.03, 192.12, 192.13
See application file for complete search history.

(56) References Cited

U.S. PATENT DOCUMENTS

| | | | |
|---|---|---|---|
| 2006/0231393 A1* | 10/2006 | Mullapudi | H01J 37/3497 204/298.16 |
| 2013/0313108 A1 | 11/2013 | Yoshida | |
| 2015/0376775 A1 | 12/2015 | Yoshida | |
| 2017/0114448 A1* | 4/2017 | Mullapudi | C23C 14/352 |

FOREIGN PATENT DOCUMENTS

| | | |
|---|---|---|
| JP | 2005-048222 A | 2/2005 |
| KR | 10-2013-0121935 A | 11/2013 |

* cited by examiner

*Primary Examiner* — Rodney G McDonald
(74) *Attorney, Agent, or Firm* — Fenwick & West LLP

(57) ABSTRACT

A magnetron sputtering apparatus is provided. The apparatus comprises: a vacuum chamber storing a substrate; a plurality of sputtering mechanisms, each including a target having one surface facing the inside of the vacuum chamber, a magnet array, and a moving mechanism for reciprocating the magnet array between a first position and a second position on the other surface of the target; a power supply for forming plasma by supplying power to targets of selected sputtering mechanisms for film formation; a gas supplier for supplying a gas for plasma formation into the vacuum chamber; and a controller for outputting a control signal, in performing the film formation, such that magnet arrays of selected and unselected sputtering mechanisms, extension lines of moving paths of the magnet arrays thereof intersecting each other in plan view, move synchronously or are located at certain positions so as to be distinct from each other.

8 Claims, 20 Drawing Sheets

MAGNETRON SPUTTERING APPARATUS AND MAGNETRON SPUTTERING METHOD

CROSS-REFERENCE TO RELATED APPLICATIONS

This application claims priority to and the benefit of Japanese Patent Application No. 2020-169360, filed on Oct. 6, 2020, the disclosure of which is incorporated herein by reference in its entirety.

TECHNICAL FIELD

The present disclosure relates to a magnetron sputtering apparatus and a magnetron sputtering method.

BACKGROUND

In manufacturing a semiconductor device, various films are formed on a semiconductor wafer (hereinafter, referred to as "wafer") that is a substrate, and such film formation is often performed by a magnetron sputtering apparatus. Japanese Patent Application Publication No. 2005-48222 discloses an example of a magnetron sputtering apparatus. The apparatus disclosed in Japanese Patent Application Publication No. 2005-48222 includes a chamber having four sets of cathodes, targets and magnet mechanisms, a shutter that has an opening and is rotatable in the chamber such that only a target used for film formation faces a substrate through the opening, and a partition member that partitions the magnet mechanisms outside the chamber. Further, the partition member and the shutter are made of a magnetic material to prevent the magnetic field formed by the magnet mechanism related to the target used for the film formation from being affected by the magnetic field formed by another magnet mechanism.

SUMMARY

The present disclosure provides a technique capable of suppressing variation in a voltage applied to a target to form plasma in performing magnetron sputtering.

To this end, the present disclosure provides a magnetron sputtering apparatus. The apparatus comprises: a vacuum chamber storing a substrate; a plurality of sputtering mechanisms, each including a target having one surface facing the inside of the vacuum chamber, a magnet array, and a moving mechanism configured to reciprocate the magnet array between a first position and a second position on the other surface of the target in order to sputter the target; a power supply configured to form plasma by supplying power to a target of each of selected sputtering mechanisms among the plurality of sputtering mechanisms so that the selected sputtering mechanisms perform film formation on the substrate, the other sputtering mechanisms being unselected sputtering mechanisms; a gas supplier configured to supply a gas for plasma formation into the vacuum chamber; and a controller configured to output a control signal, in performing the film formation, such that a magnet array of a selected sputtering mechanism and a magnet array of an unselected sputtering mechanism, wherein extension lines of moving paths of said magnet arrays intersect each other in plan view, move synchronously so as to be distinct from each other, or such that each of magnet arrays of at least two unselected sputtering mechanisms is located at a position distant from a selected sputtering mechanism between the first position and the second position, wherein extension lines from moving paths of the magnet arrays of said at least two unselected sputtering mechanisms intersect an extension line from a moving path of a magnet array of said selected sputtering mechanism in plan view.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
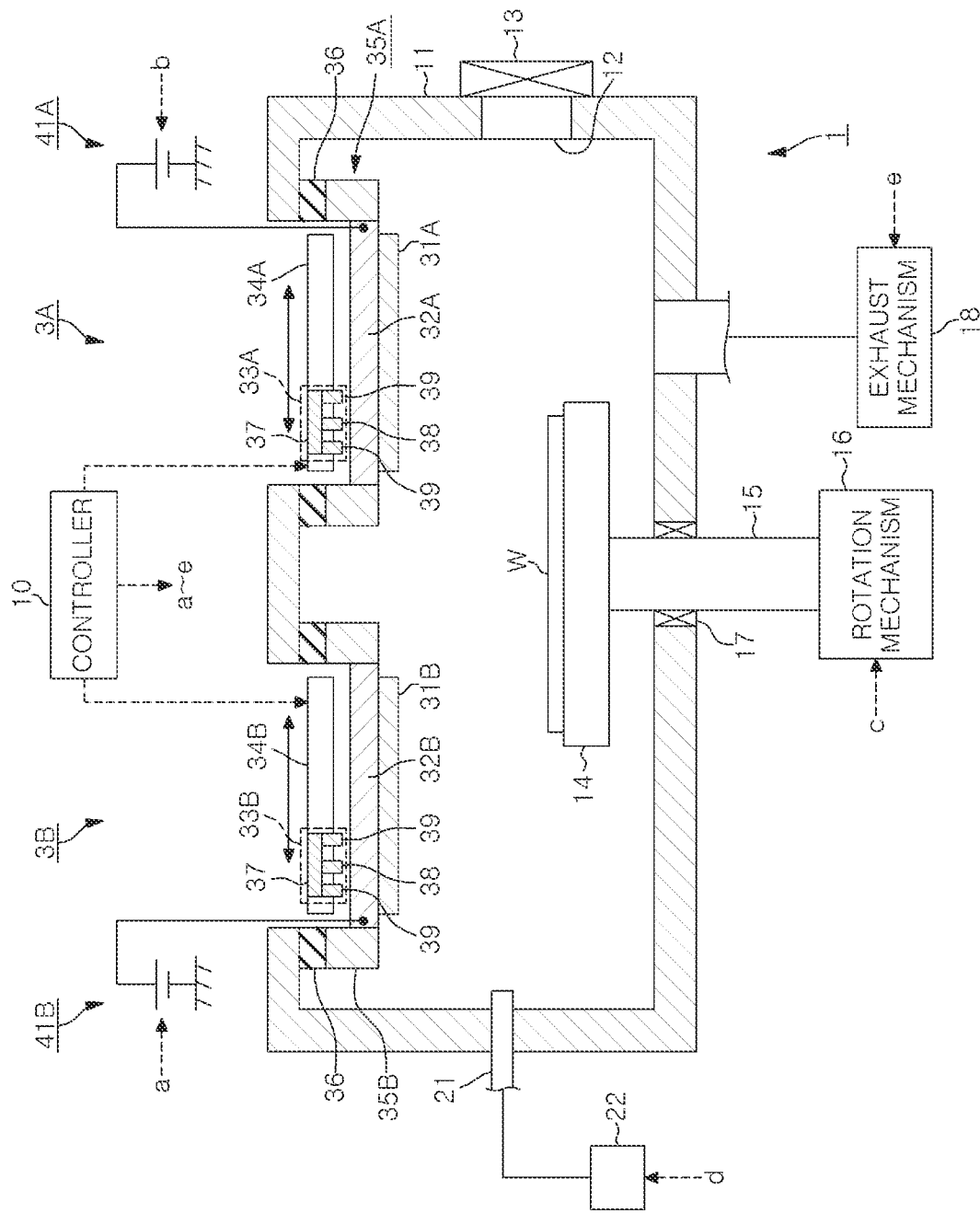
FIG. 1 is a longitudinal side view of a magnetron sputtering apparatus according to an embodiment.
Figure 2:
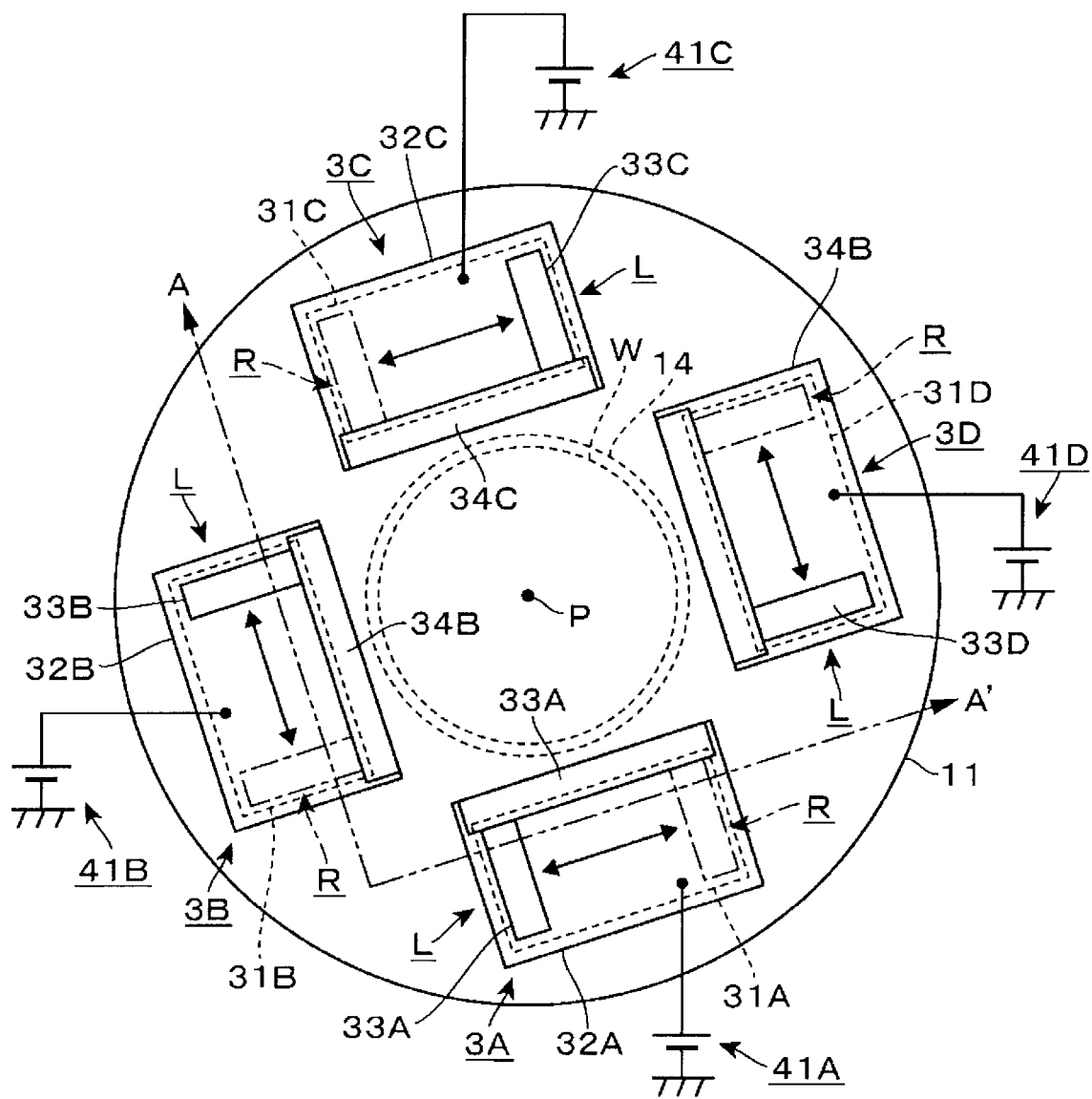
FIG. 2 is a top view of the magnetron sputtering apparatus.

A magnetron sputtering apparatus 1 according to an embodiment of the present disclosure will be described with reference to a longitudinal side view of FIG. 1 and a top view of FIG. 2. FIG. 1 is a cross-sectional view taken along arrows A-A' in FIG. 2. The magnetron sputtering apparatus 1 includes a grounded vacuum chamber 11 made of a metal. The vacuum chamber 11 has a cylindrical shape, and a transfer port 12 for loading and unloading a wafer W is opened on a sidewall of the vacuum chamber 11. The transfer port 12 is opened and closed by a gate valve 13.

A circular stage 14 provided with a heater is disposed in the vacuum chamber 11. The wafer W is horizontally placed on the circular stage 14 and heated to a desired temperature. The stage 14 is provided with an elevating pin raised and lowered by an elevating mechanism, and the wafer W is transferred between a transfer mechanism and the stage 14 by the elevating pin. The illustration of the elevating pin, the elevating mechanism, and the transfer mechanism is omitted. The stage 14 is connected to a rotation mechanism 16 disposed outside the vacuum chamber 11 through a vertical rotation shaft 15. During the film formation, the stage 14 is rotated by the rotation mechanism 16, and the wafer W placed on the stage 14 is rotated about the central axis of the wafer W. A reference numeral 17 in FIG. 1 denotes a sealing member disposed around the rotation shaft 15 to ensure airtightness in the vacuum chamber 11.

Further, the vacuum chamber 11 is provided with an exhaust mechanism 18 including a valve, a vacuum pump, or the like, and the inside of the vacuum chamber 11 is exhausted by the exhaust mechanism 18 to be in a vacuum atmosphere of a desired pressure. The vacuum chamber 11 is provided with a gas supplier 21. The gas supplier 21 is connected to an Ar (argon) gas supply mechanism 22 disposed outside the vacuum chamber 11. The Ar gas supply mechanism 22 includes a supply source of Ar gas that is a gas for plasma generation, a mass flow controller, a valve, and the like, and is configured to supply an Ar gas at a desired flow rate to the Ar gas supplier 21. The Ar gas is discharged from the gas supplier 21 into the vacuum chamber 11.

The magnetron sputtering apparatus 1 includes sputtering mechanisms 3A to 3D. The sputtering mechanisms 3A to 3D, each including, as constituent members thereof, a target 31, an electrode forming plate 32, a magnet array 33, a moving mechanism 34, and a holder 35, have the same configuration except that their respective targets 31 are made of different materials. Hereinafter, in order to clarify members constituting the sputtering mechanisms 3A to 3D, the same alphabetical characters as those of the sputtering mechanisms are added to the respective reference numerals. Specifically, the sputtering mechanism 3A include, as constituent members thereof, the target 31A, the electrode forming plate 32A, the magnet array 33A, the moving mechanism 34A, and the holder 35A.

The targets 31A, 31B, 31C and 31D of the sputtering mechanisms 3A to 3D are made of, e.g., Ta (tantalum), Cu (copper), CoFeB (cobalt, iron, boron) and Ru (ruthenium), respectively. The magnetron sputtering apparatus 1 is configured to form films respectively made of these materials on the wafer W.

Among the sputtering mechanisms 3A to 3D, the sputtering mechanism 3A will be described as a representative example. The electrode forming plate 32A has a substantially rectangular plate shape, and is disposed to close an opening formed at a ceiling portion of the vacuum chamber 11. The target 31A that is a rectangular plate is disposed below the electrode forming plate 32A to overlap the electrode forming plate 32A, and a bottom surface (one surface) of the target 31A faces the inside of the vacuum chamber 11. The holder 35A is disposed to surround a side circumference of the electrode forming plate 32A, connects the ceiling portion of the vacuum chamber 11 and the electrode forming plate 32A, and holds the electrode forming plate 32A at the ceiling portion. The holder 35A is provided with an insulating member 36 and insulates the vacuum chamber 11, the electrode forming plate 32A, and the target 31 from each other.

Figure 3:
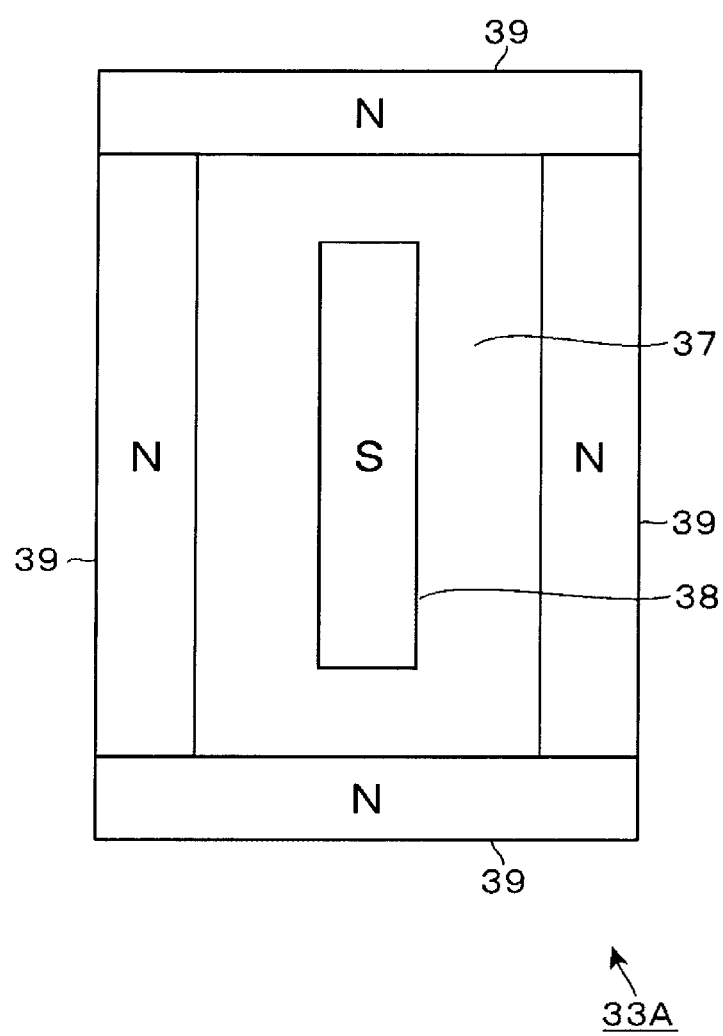
FIG. 3 is a bottom view of a magnet array of the magnetron sputtering apparatus.

Above the electrode forming plate 32A, the magnet array 33A is disposed near the electrode forming plate 32A. Therefore, the magnet array 33A is disposed on the upper surface side (other surface side) of the target 31A. FIG. 3 shows the bottom surface of the magnet array 33A. The magnet array 33A is formed in a substantially rectangular parallelepiped shape, and includes a rectangular support 37 and magnets 38 and 39 disposed below the support 37. The magnet 38 is disposed at the central portion of the support 37. The magnets 39 are spaced apart from the magnet 38 and disposed along the peripheral portion of the support 37. The magnetic pole on the lower side of the magnet 38 and the magnetic pole on the lower side of the magnets 39 are different from each other. Therefore, the magnetic pole on the upper side of the magnet 38 and the magnetic pole on the upper side of the magnets 39 are also different from each other.

Further, the support 37 of the magnet array 33A is connected to the moving mechanism 34A. The moving mechanism 34A includes a motor. By driving the motor, the magnet array 33A linearly moves along the upper surface of the electrode forming plate 32A between one end and the other end of the electrode forming plate 32A in the longitudinal direction on the electrode forming plate 32A.

The electrode forming plate 32A is connected to a DC power supply 41A, so that the electrode forming plate 32A and the target 31A serve as cathodes. When power is supplied from the DC power supply 41A to the electrode forming plate 32A in a state where the Ar gas is supplied into the vacuum chamber 11, plasma is formed in the space on the bottom surface side of the target 31A. During the plasma formation, the magnet array 33A reciprocates between one end and the other end of the electrode forming plate 32A in the longitudinal direction.

In the space on the bottom surface side of the target 31A, a plasma density in a region overlapping the magnet array 33A increases. In other words, on the bottom surface of the target 31A, sputtering is promoted at a portion overlapping the magnet array 33A. Accordingly, a large number of particles are released and adhered to the wafer W, thereby forming a film. Since the magnet array 33A reciprocates as described above, local sputtering of only a part of the target 31A can be avoided, which results in improvement of the utilization efficiency of the target 31A.

DC power supplies 41B to 41D are connected to the electrode forming plates 32B to 32D of the sputtering mechanisms 3B to 3D, respectively. Therefore, power can be supplied to each of the targets 31A to 31D of the sputtering mechanisms 3A to 3D through the electrode forming plates 32A to 32D, respectively, and plasma is formed locally below the target to which the power is supplied among the targets 31A to 31D. In other words, only some of the targets 31A to 31D are selected and sputtered to form films made of the materials of the sputtered targets on the wafer W. Among the sputtering mechanisms 3A to 3D, the sputtering mechanisms to which the power is supplied to form plasma are selected sputtering mechanisms, and the remaining sputtering mechanisms are unselected sputtering mechanisms. In this example, only one of the sputtering mechanisms 3A to 3D performs film formation as the selected sputtering mechanism.

When the plasma is formed to form a film on the wafer W as described above, the DC power supplies 41A to 41D operate such that constant power is supplied to the electrode forming plates 32A to 32D respectively connected thereto. Further, a voltage monitoring unit (not shown) is provided to monitor voltages (discharge voltages) applied to the targets 31A to 31D through the electrode forming plates 32A to 32D. The DC power supply whose discharge voltage exceeds an allowable value stops the power supply to the target.

The arrangement of the electrode forming plates 32A to 32D will be described in detail. The ceiling portion of the vacuum chamber 11 is inclined such that it becomes gradually higher from its peripheral side toward its center P side, and the electrode forming plates 32A to 32D are also inclined to be in parallel with the inclined ceiling portion such that they become gradually higher from their end portions facing the peripheral portion of the ceiling portion toward their end portions facing the center P side. Since FIG. 1 shows the cross section of the ceiling portion of the vacuum chamber 11 viewed from the peripheral side toward the center P side, the inclination of the ceiling portion and the electrode forming plates 32A to 32D are not illustrated.

The electrode forming plates 32A to 32D are spaced apart from the center P and have rotational symmetry with respect to the center P in plan view. More specifically, when the vacuum chamber 11 is viewed in the circumferential direction from the center P, the electrode forming plates 32A to 32D are spaced apart from each other with 90° interval, and the electrode forming plates 32A, 32B, 32C, and 32D are arranged in that order in the counterclockwise direction. Therefore, the sputtering mechanisms 3A to 3D are arranged in the circumferential direction at the ceiling portion of the vacuum chamber 11. The longitudinal directions of the electrode forming plates 32A to 32D (i.e., the moving directions of the magnet arrays 33A to 33D) are orthogonal to the radial direction of the ceiling portion in plan view.

Therefore, when two of the sputtering mechanisms 3A to 3D adjacent in the circumferential direction in plan view are set as a pair, the extension lines of the moving directions of the magnet arrays in any set intersect each other. More specifically, the extension lines thereof are orthogonal to each other. In other words, specifically, when the sputtering mechanisms 3A and 3B are set as a pair, the extension lines of the moving directions of the magnet arrays 33A and 33B are orthogonal to each other in plan view. When the sputtering mechanisms 3A and 3C are set as a pair, the extension lines of the moving direction of the magnet arrays 33A and 33C are orthogonal to each other in plan view. The moving directions of the magnet arrays in other combinations of the sputtering mechanisms adjacent in the circumferential direction in plan view have the same relationship as that of the magnet arrays 33A and 33B.

Since the sputtering mechanisms 3A to 3D are arranged as described above, the magnet arrays 33A to 33D move in a right-left direction in any one sputtering mechanism when viewed from the outer circumference toward the center P of the vacuum chamber 11. As described above, the magnet array corresponding to the electrode forming plate to which the power is supplied to form plasma among the electrode forming plates 32A to 32D (i.e., the magnet array included in the sputtering mechanism which has the electrode forming plate to which the power is supplied) reciprocates above the corresponding electrode forming plate, thereby performing the sputtering. On the reciprocating moving path for performing the sputtering, the right end and the left end viewed from the outer circumference toward the center P are set to a right position R and a left position L, respectively. One of the right position R and the left position L is set to a first position, and the other is set to a second position. In this example, the positional relationship between the electrode forming plate and the right position R and the left position L of the magnet array corresponding to the electrode forming plate is the same in the sputtering mechanisms 3A to 3D. In FIG. 2, the magnet arrays 33A to 33D located at the right position R are indicated by dotted lines, and the magnet arrays 33A to 33D located at the left position L are indicated by solid lines.

The magnetron sputtering apparatus 1 includes a controller 10 that is a computer (see FIG. 1), and the controller 10 includes a program. The program is stored in a storage medium such as a compact disk, a hard disk, a magneto-optical disk, a DVD, or the like and is installed in the controller 10. The controller 10 outputs control signals to individual components of the magnetron sputtering apparatus 1 based on the program to control the operation. Specifically, the control signals control on/off switching of the DC power supplies 41A to 41D, rotation of the stage 14 by the rotation mechanism 16, start and stop of supply of Ar gas by the Ar gas supply mechanism 22, exhaust by the exhaust mechanism 18, and operations such as reciprocation of the magnet arrays 33A to 33D by the moving mechanisms 34A to 34D. A group of steps is set for the program to control the operations of the respective components and perform processing to be described later.

In the magnetron sputtering apparatus 1, the operation of the magnet array 33A to 33D is controlled such that the magnetic field formed by the magnet array of the sputtering mechanism to which the power is supplied for plasma formation is less interfered by the magnetic field formed by another magnet array. By suppressing the magnetic field interference, variation in the plasma intensity is prevented. Accordingly, variation in the DC voltage applied to the electrode forming plate is suppressed. As a result, the maximum value of the voltage (maximum discharge voltage) is lowered.

Hereinafter, an operation example of the magnetron sputtering apparatus 1 will be described in detail with reference to top views of FIGS. 4 to 6. In each of the top views of FIGS. 4 to 6 and the subsequent drawings, in order to clearly show the target to which the power is supplied to perform film formation, only the DC power supply that is supplying the power to the target, among the DC power supplies 41A to 41D, is illustrated, and the DC power supplies that are not supplying the power are not illustrated.

First, the wafer W is transferred into the vacuum chamber 11, placed on the stage 14, heated to a desired temperature and rotated. The inside of the vacuum chamber 11 is set to a vacuum atmosphere of a predetermined pressure by the exhaust mechanism 18, and an Ar gas is supplied into the vacuum chamber 11 at a desired flow rate. Then, the power is supplied from the DC power supply 41C to the electrode forming plate 32C constituting the sputtering mechanism 3C in a state where the magnet arrays 33A to 33D of the sputtering mechanisms 3A to 3D are located at the left position L, for example. Plasma of the Ar gas is formed below the target 31C connected to the electrode forming plate 32C.

Figure 4:
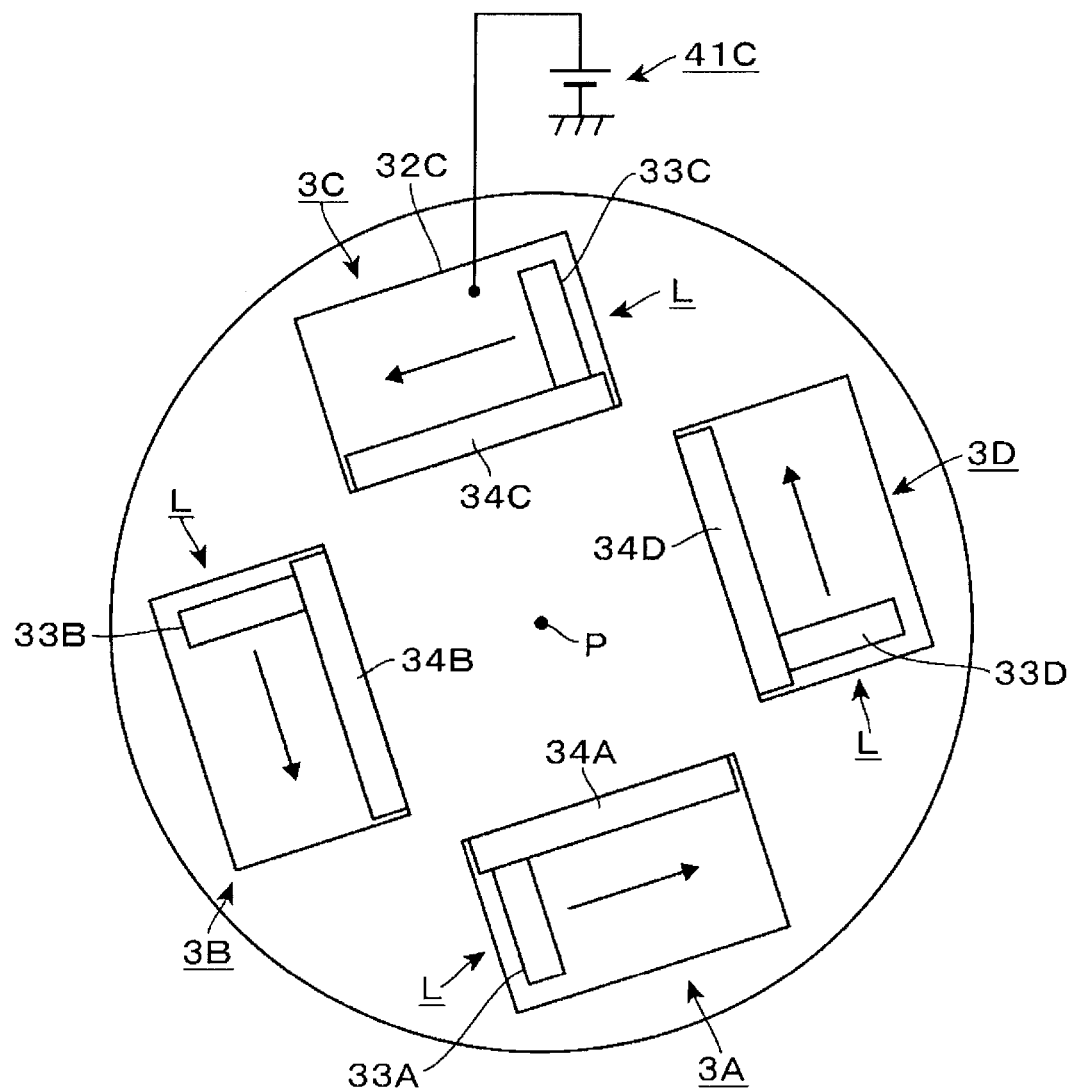
FIGS. 4 to 6 are top views of the magnetron sputtering apparatus showing an operation example of the magnet array.

During the plasma formation, the motors constituting the moving mechanisms 34A to 34D rotate at the same speed, so that the magnet arrays 33A to 33D start to move toward the right position R at the same speed (see FIG. 4). FIG. 5 shows a state in which the magnet arrays 33A to 33D are located between the right position R and the left position L.

Figure 5:
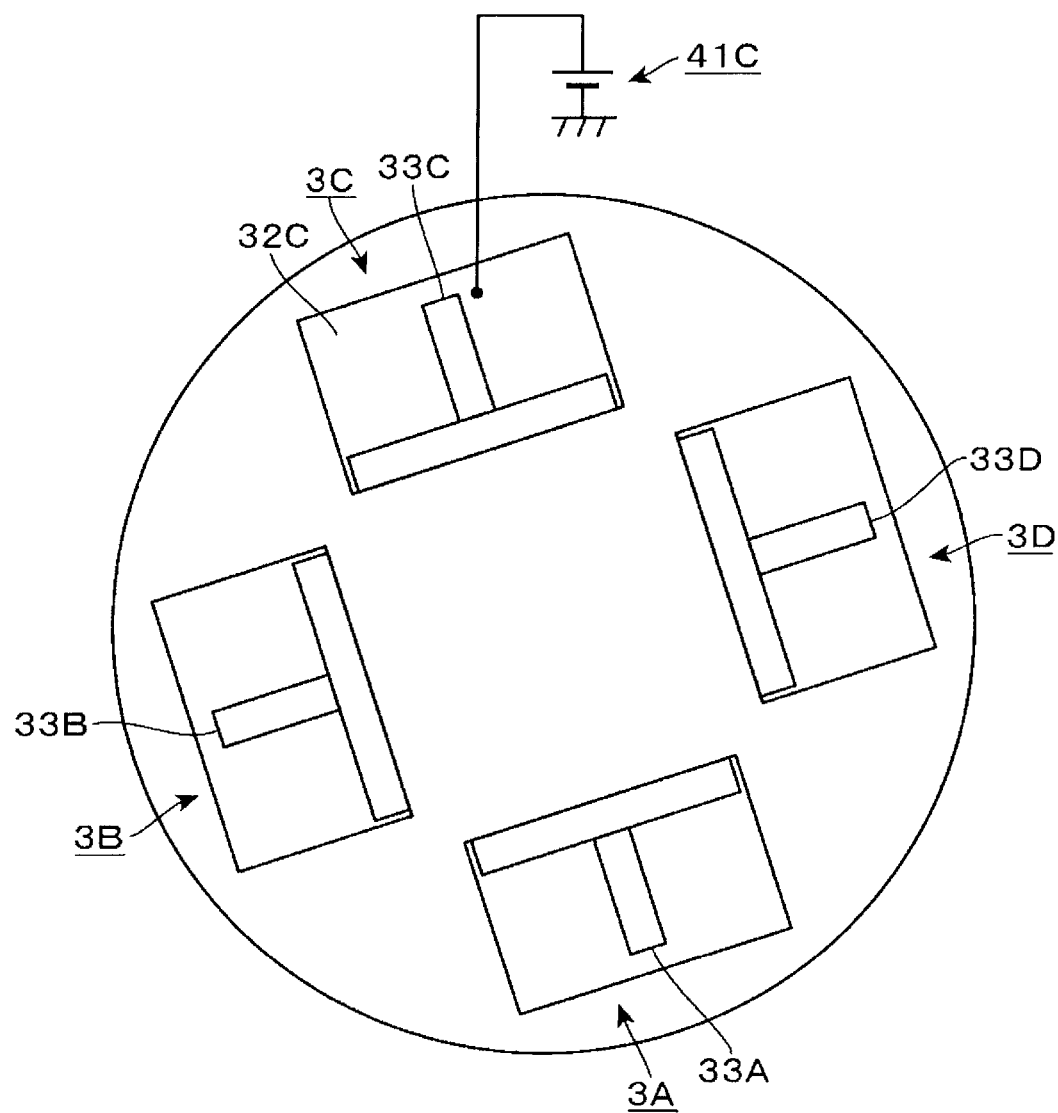
Figure 6:
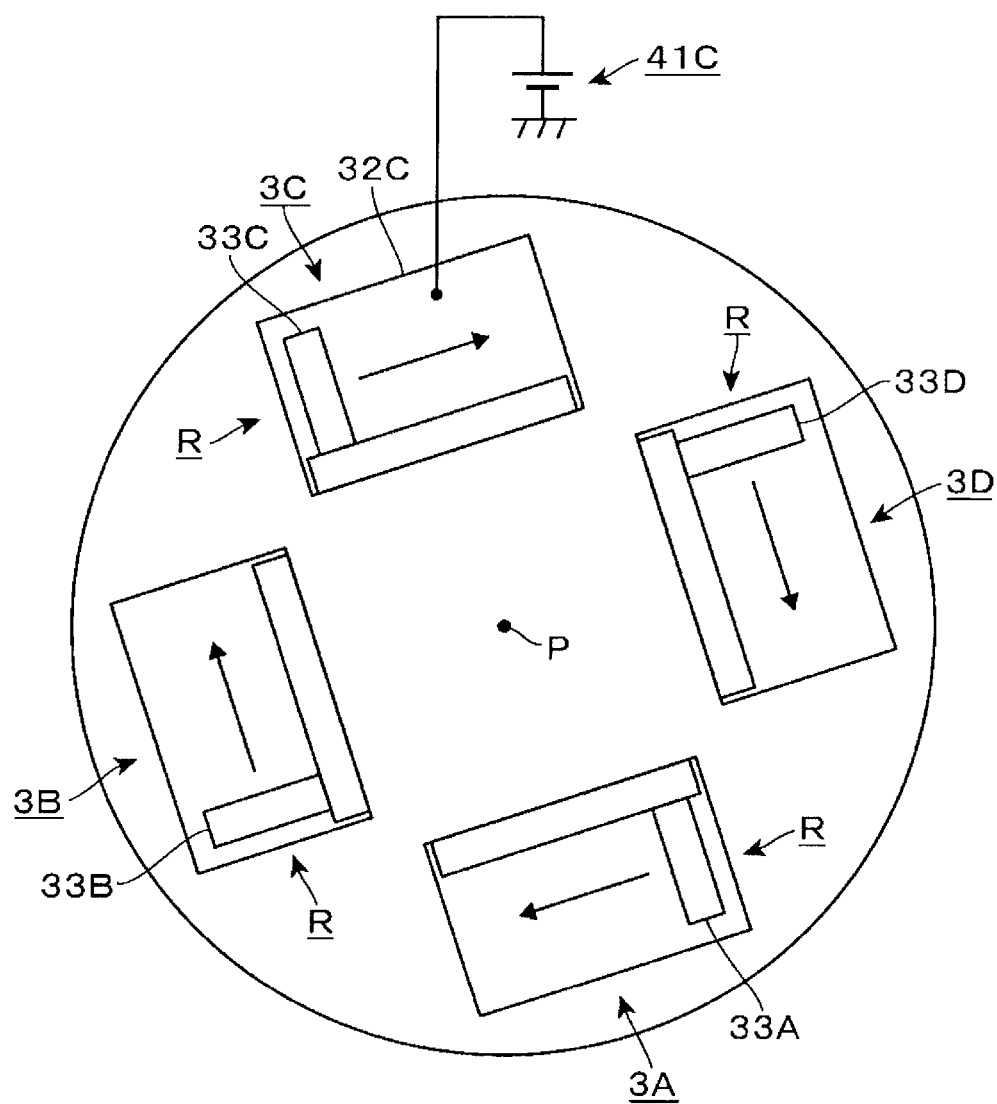

When the magnet arrays 33A to 33D reach the right position R at the same time, the motors switch the rotation directions and rotate at the same speed, so that the magnet arrays 33A to 33D start to move toward the left position L at the same speed (see FIG. 6). Accordingly, the magnet arrays 33A to 33D reach the position state shown in FIG. 5 and then to the left position L at the same time, and thereafter start to move toward the right position R at the same speed as shown in FIG. 4.

Then, the movement (reciprocation) of the magnet arrays 33A to 33D shown in FIGS. 4 to 6 is repeated. Therefore, all the magnet arrays 33A to 33D move synchronously toward the same position between the right position R and the left position L. The synchronous movement means that a plurality of magnet arrays reciprocating in their respective moving paths (reciprocating paths) move altogether toward one end of the moving paths and move toward the other end of the moving paths. On a virtual circle centered on the center P of the vacuum chamber 11 and passing through the centers of the magnet arrays 33A to 33D in plan view, the relative positions of the magnet arrays 33A to 33D located at the left position L and those located at the right position R are the same because the magnet arrays 33A to 33D move synchronously. For example, the speed at which the magnet arrangements 33A to 33D move toward the right position R and the speed at which the magnet arrangements 33A to 33D move toward the left position L are the same, and the magnet arrangements 33A to 33D are regularly located at the right position R and the left position L.

During such synchronous reciprocation, while the magnet array 33C of the sputtering mechanism 3C to which the power is supplied is moving toward the left position L, the magnet array 33B also moves toward the left position L so as to get distant from the magnet array 33C. Further, while the magnet array 33C is moving toward the right position R, the magnet array 33D (another magnet array) also moves toward the right position R so as to get distant from the magnet array 33B. Since the magnet arrays 33B, 33C, and 33D reciprocate synchronously, the magnet array 33C is prevented from being close to the magnet arrays 33B and 33D that have moving paths whose extension lines intersect the extension line of the moving path of the magnet array 33C. Therefore, the magnetic field formed by the magnet array 33C is less interfered by the magnetic field formed by the magnet arrays 33B and 33D.

Since the magnet arrays 33A and 33C are located relatively distant from each other, the magnetic field formed by the magnet array 33C is less likely interfered by the magnetic field formed by the magnet array 33A. As described above, the magnet arrays 33A and 33C move synchronously toward the same position between the right position R and the left position L. Accordingly, although both the magnet arrays 33A and 33C are located at the right position R or the left position L at the same time, the distance between the magnet arrays 33A and 33C remains sufficiently far (see FIGS. 4 and 6). Since the distance therebetween is kept sufficiently far, it is considered that the magnetic field interference between the magnet arrays 33A and 33C is more reliably suppressed.

The magnetic field formed by the magnet array 33C in the sputtering mechanism 3C that forms the plasma is less likely interfered by the magnetic field formed by the magnet arrays 33A, 33B, and 33D. Therefore, the variation in the plasma intensity below the target 31C due to the magnetic field interference is suppressed. Accordingly, variation in the voltage applied to the target 31C is suppressed. The region where the plasma intensity is relatively high, i.e., the region of the target 31C where the sputtering is promoted, moves along the bottom surface of the target 31C by the reciprocation of the magnet array 33C. Sputter particles, i.e., CoFeB, released by the sputtering are adhered to the surface of the wafer W to form a CoFeB film.

When a predetermined period of time elapses after the power supply to the target 31C, the DC power supply 41C is turned off and the power supply to the electrode forming plate 32C is stopped. Instead, one of the DC power supplies 41A, 41B, 41D is turned on to start the power supply to the corresponding one of the targets 31A, 31B, and 31D. In the case of supplying the power to any one of the targets 31A, 31B, and 31D, the magnet arrays 33A to 33D reciprocate synchronously toward the same position between the right position R and the left position L, as in the case of supplying the power to the target 31C. As described above, the sputtering mechanisms 3A to 3D are formed with rotational symmetry. Therefore, the magnetic field formed by the magnet array corresponding to the target to which the power is supplied, among the targets 31A, 31B, and 31D, is less likely interfered by the magnetic field formed by other magnet arrays, similarly to the magnetic field formed by the magnet array 33C in the case of sputtering the target 31C. Hence, a film made of the material of the target is formed on the wafer W in a state where variation in the voltage applied to the target is suppressed.

For example, thereafter, the targets to which the power is supplied through the electrode forming plate are sequentially switched among the targets 31A to 31D, and the magnet arrays 33A to 33D reciprocate synchronously toward the same position between the right position R and the left position L during the plasma generation by such power supply. In other words, when the sputtering mechanisms adjacent in the circumferential direction in plan view among the sputtering mechanisms 3A to 3D are set as a pair, the magnet arrays in any pair continue to reciprocate synchronously without getting close to each other. Accordingly, films are sequentially laminated on the wafer W in a state where the variation in the voltage applied to the targets 31A to 31D is suppressed. When a laminated film of a desired structure is formed, the supply of Ar gas into the vacuum chamber 11 and the power supply to the targets 31A to 31D are stopped to stop the plasma generation in the vacuum chamber 11 and, also, the movement of the magnet arrays 33A to 33D and the rotation of the wafer W are stopped. Then, the wafer W is unloaded from the vacuum chamber 11 by the transfer mechanism.

In accordance with the magnetron sputtering apparatus 1, the magnetic field interference between the magnet arrays 33A to 33D can be suppressed, so that the variation in the voltages applied to the electrode forming plates 32A to 32D can be suppressed. Therefore, even if the power supplied to the electrode forming plates 32A to 32D is set to a relatively high value, the maximum value of the voltage applied to each of the electrode forming plates 32A to 32D can be set to a relatively small value. Accordingly, it is possible to prevent the operation stop of the DC power supplies 41A to 41D due to the voltage exceeding an allowable value, so that the wafer W can be stably processed. By setting the power supplied to the electrode forming plates 32A to 32D to a high value, the plasma of the Ar gas can be efficiently formed. Hence, it is possible to reduce the flow rate of the Ar gas supplied to the vacuum chamber 11 and to increase the film forming rate for the wafer W.

As described above, the magnetron sputtering apparatus 1 is configured to form films of multiple types of materials on the wafer W. Therefore, the magnetron sputtering apparatus 1 is suitable for manufacturing a magnetic tunnel junction (MTJ) element that is a multilayer film used for a magnetoresistive random access memory (MRAM) or a magnetic head of a hard disk, for example. However, the use of the magnetron sputtering apparatus 1 is not limited thereto. The magnetron sputtering apparatus 1 may also be used for formation of a single layer film without being limited to the formation of a laminated film.

In the above example, the case in which the magnet arrays 33A to 33D reciprocate in the same manner has been described. However, they may reciprocate in different manners. Specifically, for example, the distances between the left position L and the right position R may be different for the magnet arrays 33A to 33D. In that case, the magnet arrays 33A to 33D may move at different speeds by the moving mechanisms 34A to 34D depending on the distance difference, and the timing at which the magnet arrays 33A to 33D reach the right position R and the timing at which they reach the left position L may be the same.

During a single reciprocating operation of the magnet arrays 33A to 33D, the timings at which they reach the right position R and the timings at which they reach the left position L may be slightly different in the magnet arrays 33A to 33D. Therefore, the operations of the magnet arrays 33A to 33D may be different due to the accuracy limit of the operation control of the sputtering mechanisms 3A to 3D. However, if the timings at which they reach the right position R and the timings at which they reach the left position L are considerably different for the magnet arrays 33A to 33D, it may be difficult to ensure sufficient distances between the magnet array of the sputtering mechanism to which the power is supplied and the magnet arrays on both sides thereof in the circumferential direction. Therefore, it is preferable to keep the difference in the timings at which the magnet arrays 33A to 33D reach the right position R (the difference between the time at which a first one of the magnet array reaches the right position R first and the time at which a last one of the magnet array reaches the right position R last) small, preferably 1 second or less. Similarly, it is preferable to keep the difference in the timings at which the magnet arrays 33A to 33D reach the left position L small, preferably 1 second or less.

Figure 7:
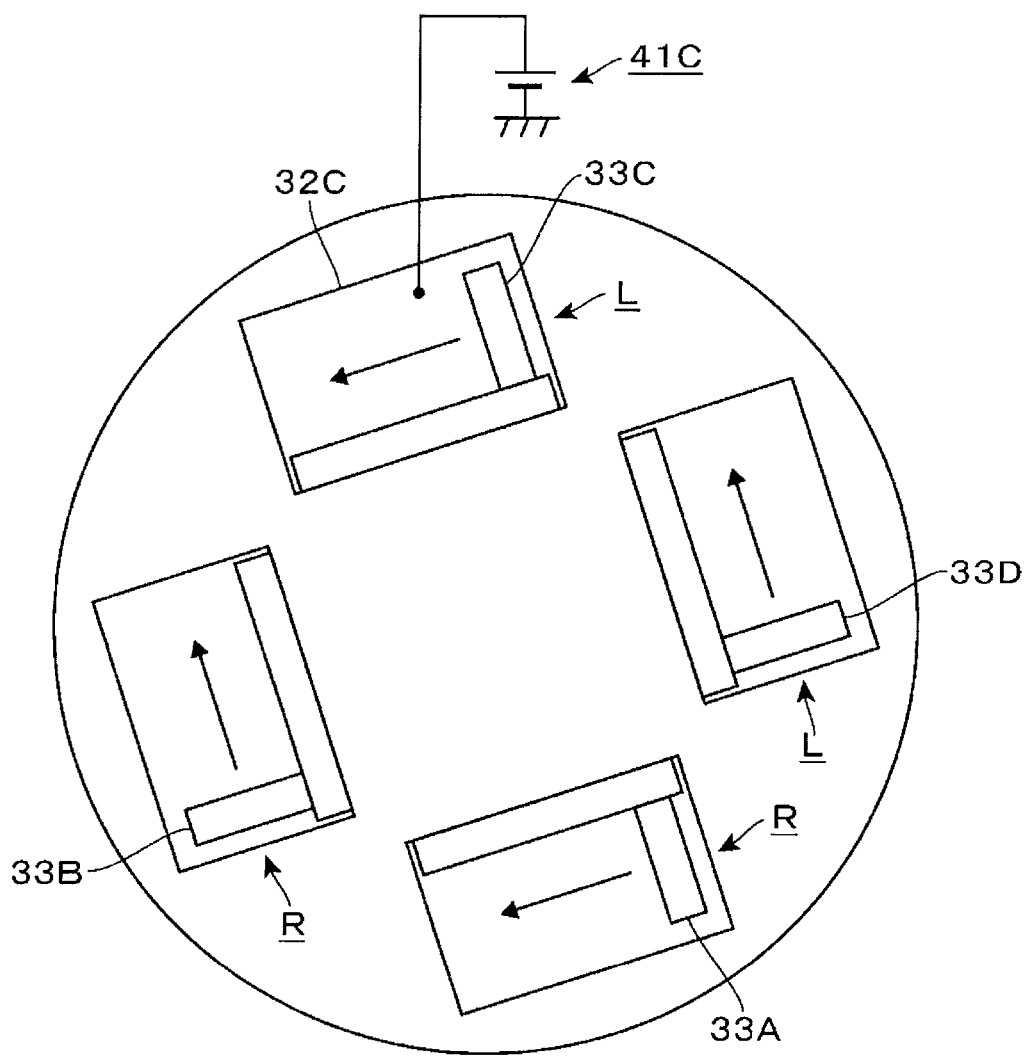
FIGS. 7 and 8 are top views of the magnetron sputtering apparatus showing another operation example of the magnet array.
Figure 8:
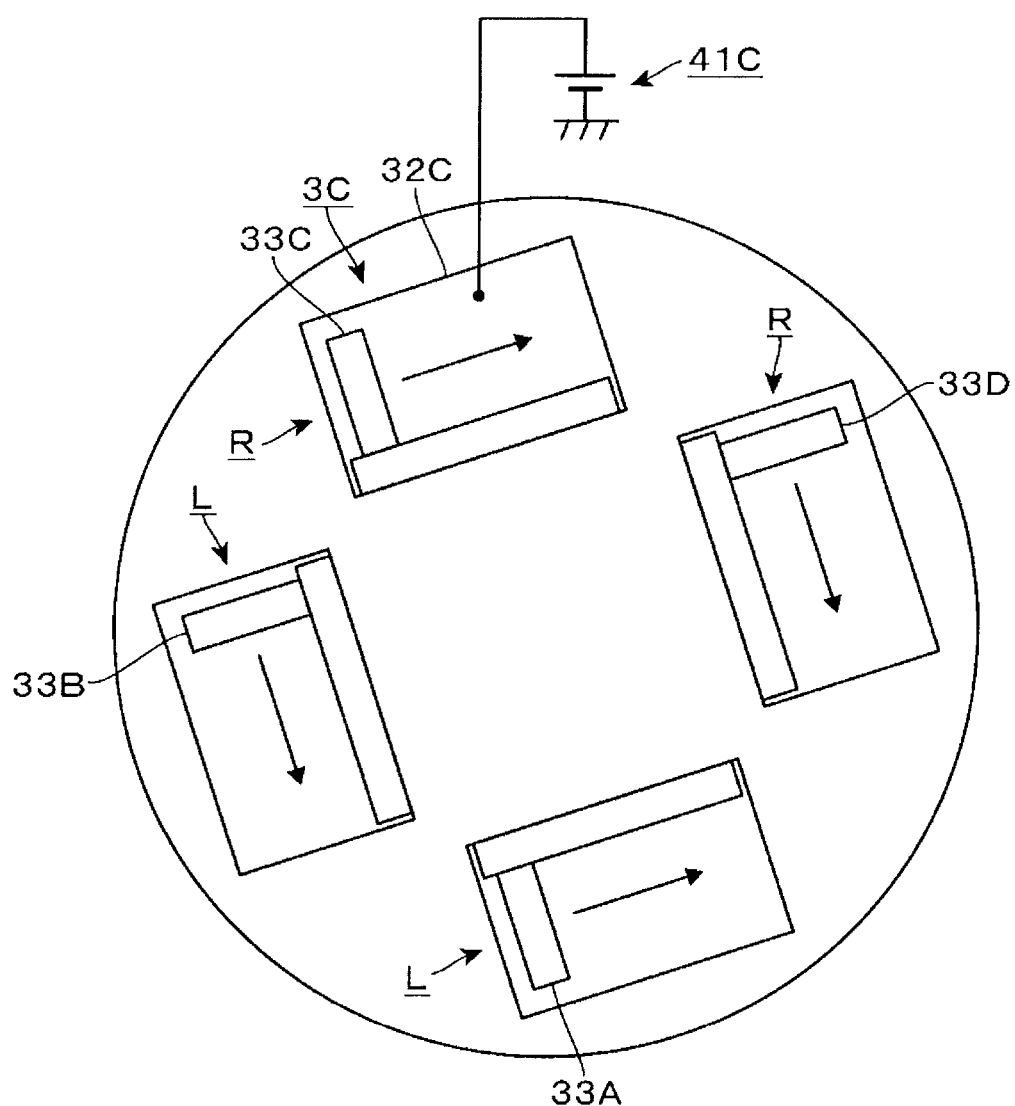

The operation of synchronously reciprocating all the magnet arrays 33A to 33D toward the same position between the left position L and the right position R is referred to as "full synchronous reciprocation." In the case of processing the wafer W, the full synchronous reciprocation is not necessarily performed. FIGS. 7 and 8 show different operation examples of the magnet arrays 33A to 33D, and the differences between these operation examples and the full synchronous reciprocation will be mainly explained.

For example, in a state where the magnet arrays 33A and 33B are located at the right position R and the magnet arrays 33C and 33D are located at the left position L, power is supplied to the electrode forming plate 32C, and the target 31C connected to the electrode forming plate 32C is sputtered to start film formation (see FIG. 7). Then, the magnet arrays 33A and 33B move to the left position L and the magnet arrays 33C and 33D move to the right position R (see FIG. 8). Next, the magnet arrays 33A and 33B move to the right position R and the magnet arrays 33C and 33D move to the left position L, so that the arrangement of the magnet arrays 33A to 33D returns to the state shown in FIG. 7. Thereafter, the above-described series of movements of the magnet arrays 33A to 33D are repeated. Hence, the arrangement of the magnet arrays 33A to 33D is alternately switched between the state shown in FIG. 7 and the state shown in FIG. 8.

Even if the magnet arrays 33A to 33D reciprocate in this way, the variation in the voltage applied to the electrode forming plate 32C is suppressed as can be seen from evaluation tests to be described later. This may be because the magnet arrays 33C and 33D do not get close to each other as in the case of the full synchronous reciprocation, and, thus, the magnetic field interference between the magnet arrays is suppressed. Further, as shown in FIG. 8, when the magnet array 33C moves from the right position R to the left position L, the magnet array 33B adjacent to the magnet array 33C in the circumferential direction moves toward the right position R so as to get distant from the magnet array 33C. Therefore, compared to the case where the magnet array 33B is fixed at the left position L, for example, the period in which the magnet arrays 33C and 33B get close to each other is shorter, and, thus, the magnetic field of the magnet array 33C is less likely affected by the magnetic field of the magnet array 33B.

However, when the magnet array 33C moves toward the right position R, it gets close to the magnet array 33B that is moving toward the left position L. Due to the magnetic field interference of the magnet arrays 33C and 33B at that time, the voltage variation may become relatively large. Therefore, in order to more reliably suppress the voltage variation and reduce the risk of the operation stop of the DC power supply 41C, it is more preferable to perform the full synchronous reciprocation.

Hereinafter, the operation as shown in FIGS. 7 and 8 in which two magnet arrays 33A to 33D adjacent in the circumferential direction are set as a pair, the magnet arrays in the same pair reciprocate synchronously toward the same position between the left position L and the right position R, and the magnet arrays in different pairs reciprocate synchronously toward the opposite positions is referred to as "semi-synchronous reciprocation." In the case of performing processing using the semi-synchronous reciprocation, the power was supplied to the electrode forming plate 32C in the examples of FIGS. 7 and 8. However, the processing may be performed by supplying the power to the electrode forming plate 32A, 32B or 32D instead of the electrode forming plate 32C.

In the examples of FIGS. 7 and 8, the two magnet arrays 33C and 33D reciprocate synchronously toward the same position between the left position and the right position. However, the three magnet arrays 33B, 33C and 33D may reciprocate synchronously toward the same position between the left position and the right position. In that case, as described in the example of the full synchronous reciprocation, the magnetic field interference between the magnet arrays 33B and 33C is more reliably suppressed, which is preferable.

Figure 9:
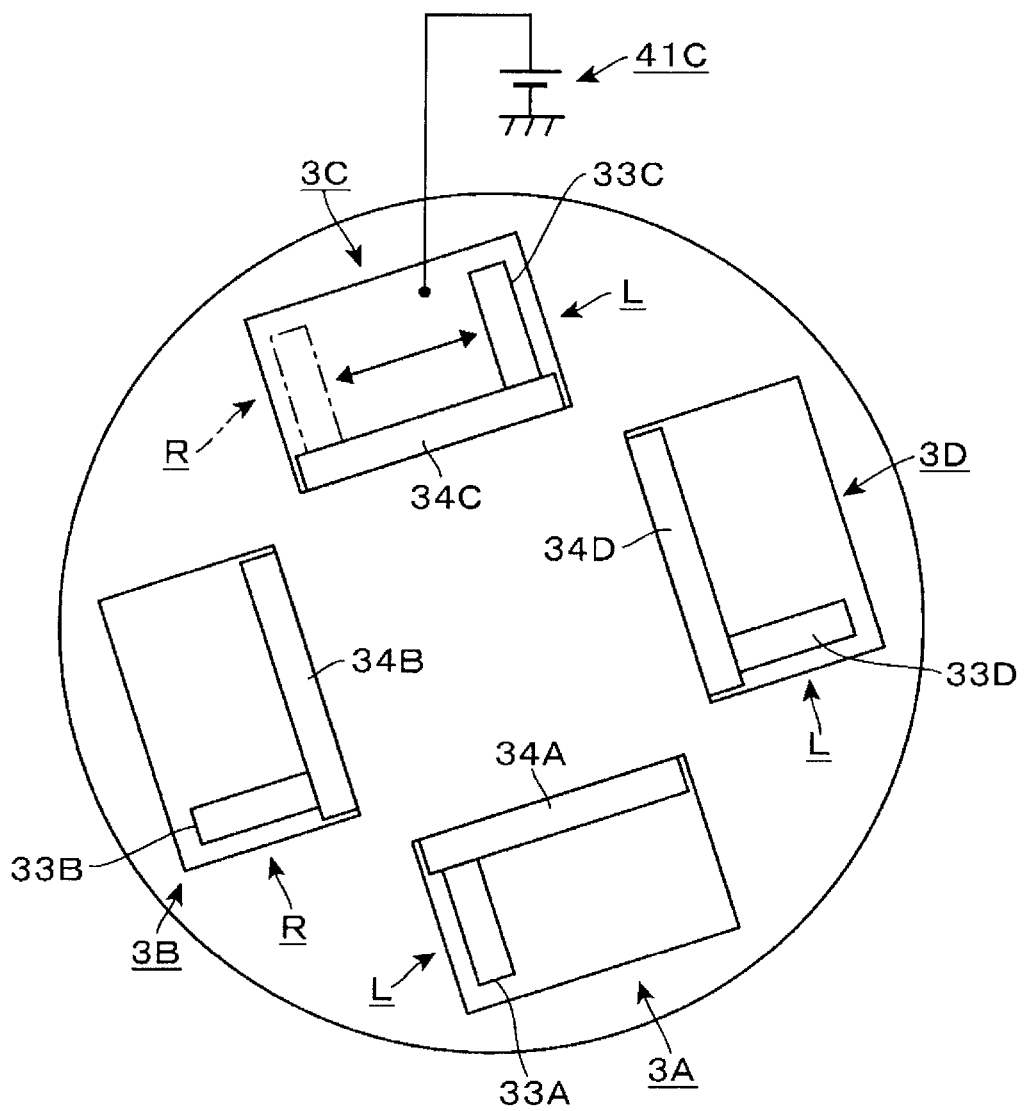
FIGS. 9 and 10 are top views of the magnetron sputtering apparatus showing arrangement examples of the magnet array.

FIG. 9 shows an operation example of the magnet arrays 33A to 33C. In this example as well, the power is supplied to the electrode forming plate 32C of the sputtering mechanism 3C to form plasma, and the magnet array 33C reciprocates to process the wafer W. Meanwhile, the magnet array 33B is stopped at the right position R, and the magnet array 33D is stopped at the left position L. In other words, the magnet arrays 33B and 33D of the sputtering mechanisms 3B and 3D (unselected sputtering mechanism) are stopped at positions distant from the sputtering mechanism 3C (selected sputtering mechanism) between the left position L and the right position R.

Since the magnet arrays 33B and 33D are stopped at the farthest positions within their respective reciprocation ranges from the magnet array 33C, the magnetic field interference between the magnet arrays 33C and the magnet arrays 33B and 33D is suppressed, and the variation in the voltage applied to the electrode forming plate 32C is suppressed as in the above-described examples. In the example shown in FIG. 9, the magnet array 33A is stopped at the left position L. However, the magnet array 33A is relatively far from the magnet array 33C and, thus, the magnetic field interference will be suppressed. Therefore, it is not necessary to stop the magnet array 33A at the left position L, and the magnet array 33A may be stopped at the right position R or may reciprocate in the right-left direction.

Although the example of performing processing by supplying the power to the electrode forming plate 32C has been described, when the power is supplied to another electrode forming plate, the magnet array to reciprocate and the magnet array to stop may be changed from the example shown in FIG. 9 while maintaining the rotational symmetry. For example, in the case of performing processing by supplying the power to the electrode forming plate 32B, the magnet array 33B corresponding to the electrode forming plate 32B reciprocates between the right position R and the left position L, whereas the magnet arrays 33A and 33C are stopped at the left position L and the right position R, respectively, so as to remain distant from the magnet array 33B.

Figure 10:
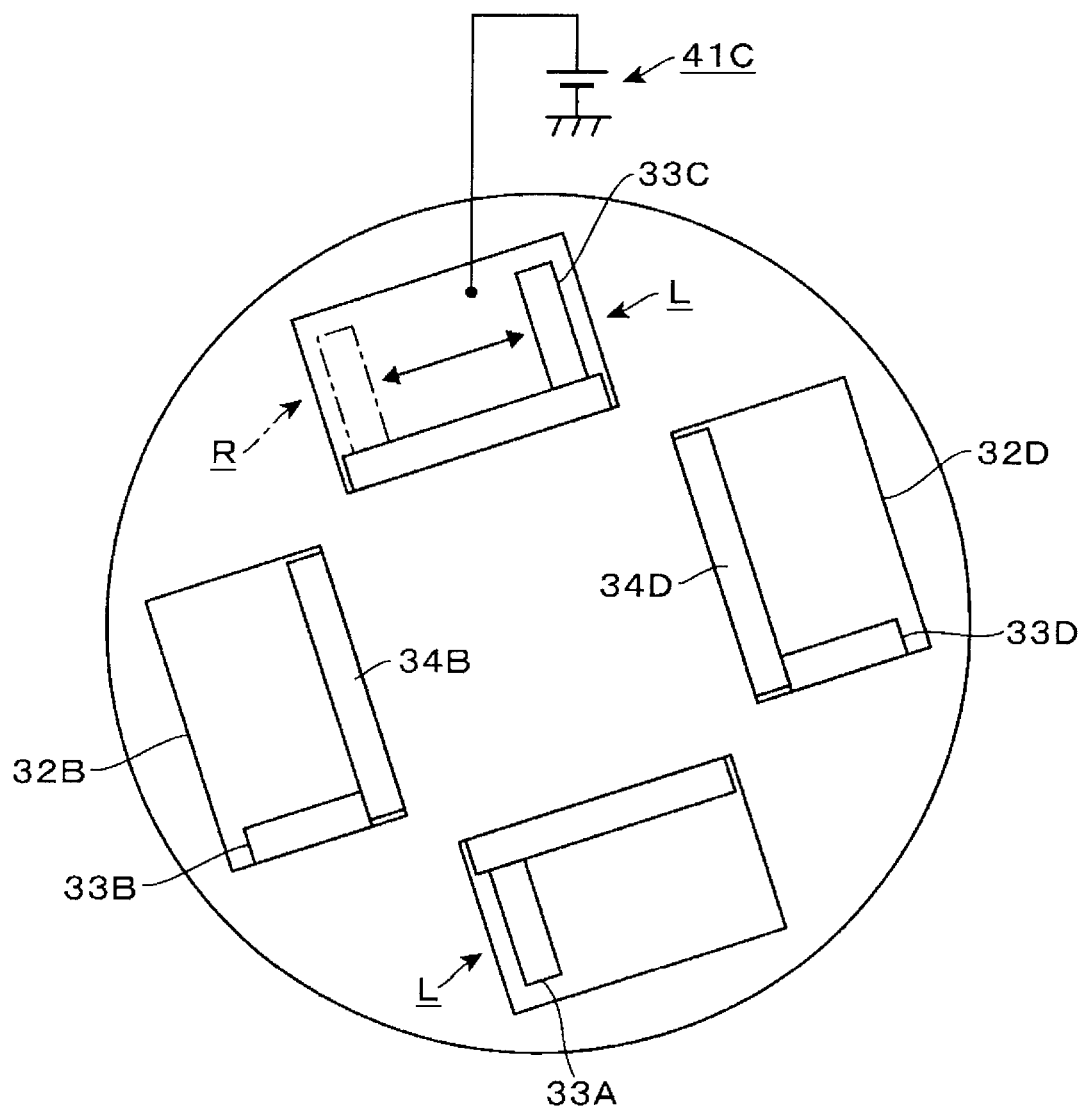

For example, in the case of performing processing by supplying the power to the sputtering mechanism 3C as described in FIG. 9, it is preferable to move the magnet array 33B to a position farther from the sputtering mechanism 3C than the right position R is by the moving mechanism 34B, if possible. Similarly, it is preferable to move the magnet array 33D to a position farther from the sputtering mechanism 3C than the left position L is by the moving mechanism 34D, if possible (see FIG. 10). In other words, in the case of performing processing by supplying the power to the sputtering mechanisms 3B and 3D, the processing is performed by reciprocating the magnet arrays 33B and 33D between the left position L and the right position R as shown in FIG. 2 and the like. However, in order to suppress the magnetic field interference with the magnet array 33C, the magnet arrays 33B and 33D may be retreated to a position outside the range in which they reciprocate for processing so as to get more distant from the magnet array 33C.

As shown in FIG. 9 and the like, in the case of performing processing by supplying the power to the sputtering mechanism 3C, it is considered that the magnetic field interference can be better suppressed and the voltage variation can be better suppressed as the distances between the magnet arrays 33B and 33D and the magnet array 33C increase. However, it is presumed that a sufficient effect can be obtained if certain distances are secured between the magnet arrays 33B and 33D and the magnet array 33C. In other words, the magnet arrays 33B and 33D may be retreated to a position slightly closer to the sputtering mechanism 3C than the position described in FIG. 9, and the magnet arrays 33B and 33D may be located at the position farther from the sputtering mechanism 3C between the right position R and the left position L. More specifically, the position farther from the sputtering mechanism 3C between the right position R and the left position L indicates a region farther from the sputtering mechanism 3C with respect to an intermediate position that bisects the reciprocating moving path between the right position R and the left position L. In that region, the magnet arrays 33B and 33D are not necessarily stopped and may be moved.

Figure 11:
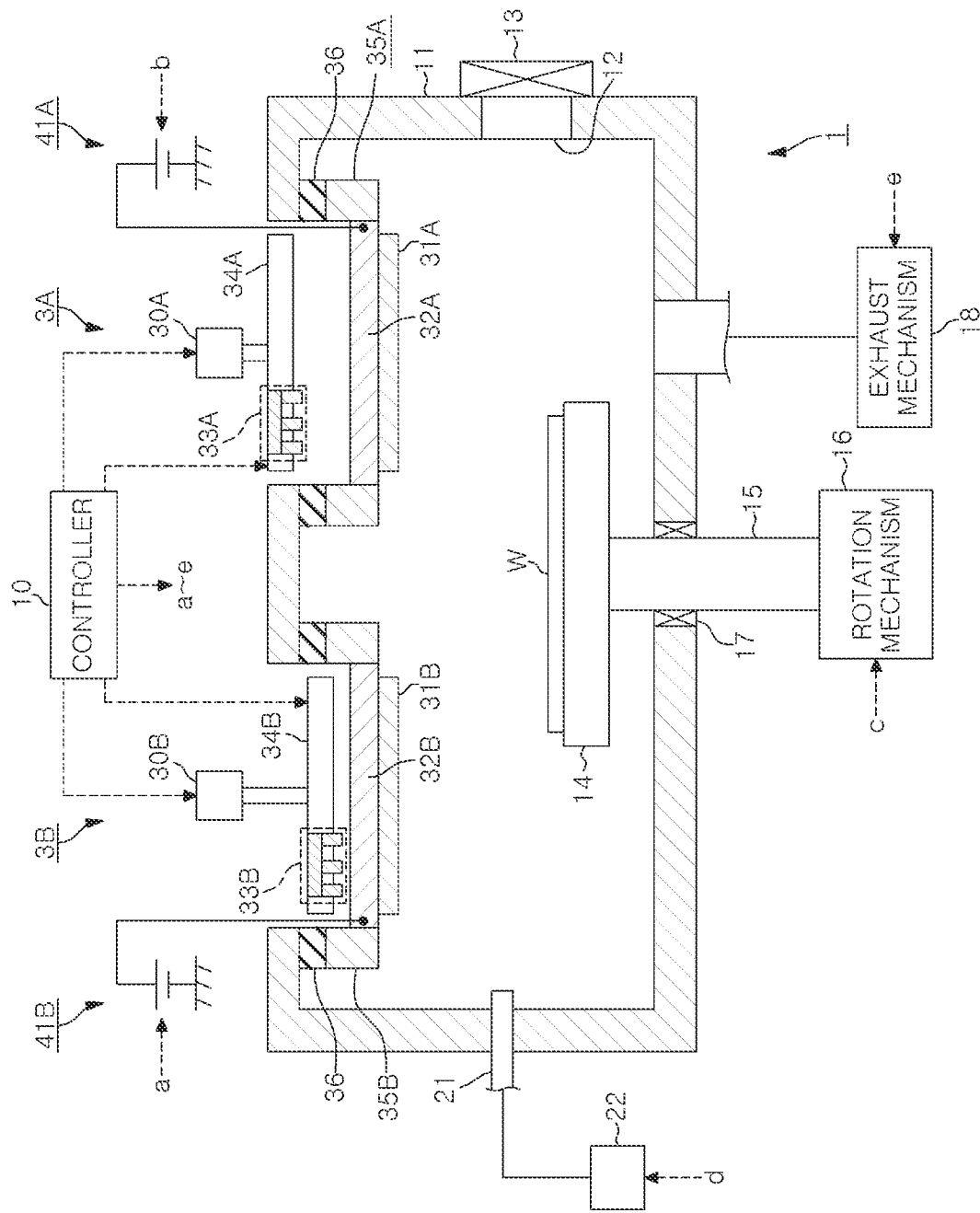
FIG. 11 is a longitudinal side view showing another configuration example of the magnetron sputtering apparatus.
Figure 12:
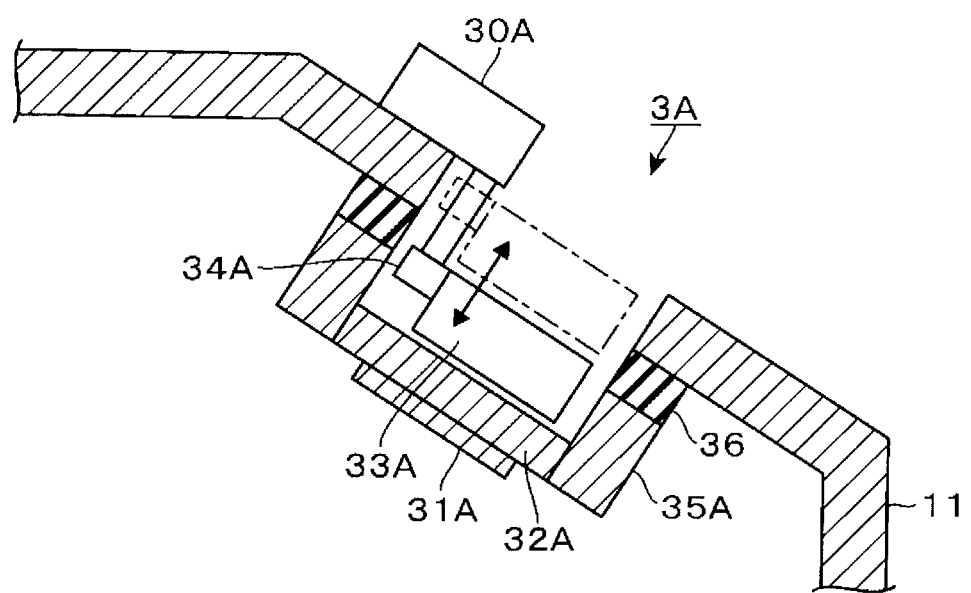
FIG. 12 is a longitudinal side view of a sputtering mechanism of the magnetron sputtering apparatus.

Next, a magnetron sputtering apparatus 1A that is a modification of the magnetron sputtering apparatus 1 will be described mainly based on the difference therebetween with reference to the longitudinal side view of FIG. 11. Sputtering mechanisms 3A, 3B, 3C, and 3D of the magnetron sputtering apparatus 1A include elevating mechanism 30A, 30B, 30C, and 30D, respectively, whose operations are controlled by output control signals from the controller 10. For convenience of illustration, FIG. 11 only shows the elevating mechanisms 30A and 30B among the elevating mechanisms 30A to 30D. The sputtering mechanisms 3A to 3D of the magnetron sputtering apparatus 1A have the same configuration. FIG. 12 shows the longitudinal side view of the sputtering mechanism 3A viewed from a direction different from that of FIG. 11.

The elevating mechanisms 30A to 30D are disposed at the ceiling portion of the vacuum chamber 11 and connected to the moving mechanisms 34A to 34D, respectively. The elevating mechanisms 30A to 30D vertically move the magnet arrays 33A to 33D along the direction orthogonal to the plane direction of the electrode forming plates 32A to 32D using the moving mechanisms 34A to 34D, and move the magnet arrays 33A to 33D between a processing position near the electrode forming plates 32A to 32D and a retreat position above the processing position. In FIG. 12, a state in which the magnet array 33A is located at the processing position (first height position) is indicated by a solid line and a state in which the magnet array 33A is located at the retreat position (second height position) is indicated by a dotted line.

Figure 13:
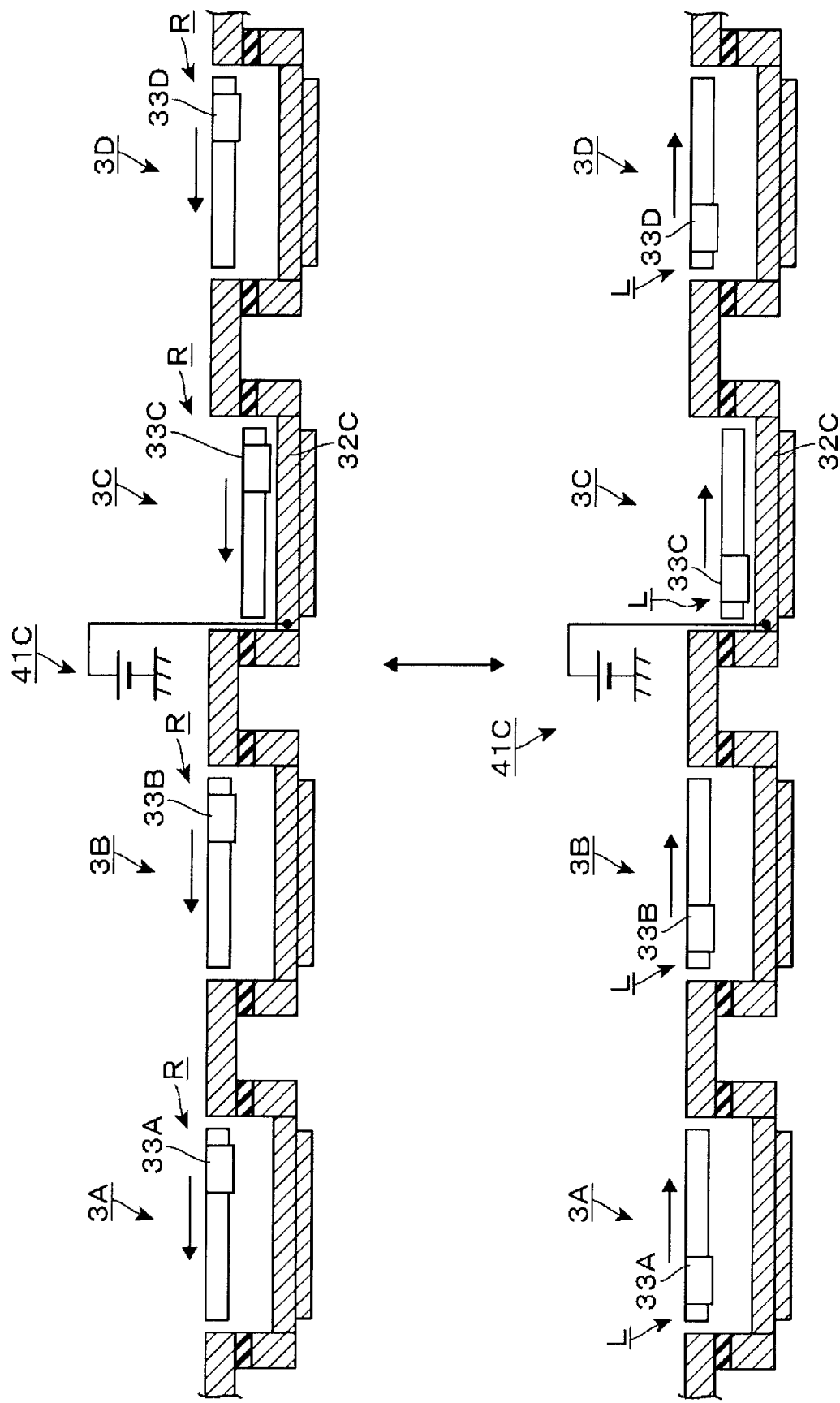
FIG. 13 is a development view showing a longitudinal side of a ceiling portion of the magnetron sputtering apparatus.

FIG. 13 is a longitudinal cross-sectional view of the magnetron sputtering apparatus 1A developed along the circumferential direction of the vacuum chamber 11. The operation example of the magnetron sputtering apparatus 1A will be described with reference to FIG. 13. For example, as described in FIGS. 4 to 6, the processing is performed by supplying the power to the target 31C and performing full synchronous reciprocation of the magnet arrays 33A to 33D. At that time, the magnet array 33C reciprocates at the processing position to form plasma on the bottom surface of the target 31C. The magnet arrays 33A, 33B, and 33D, which are not involved in the plasma formation, reciprocate at their retreat positions. Since the heights of the magnet arrays are different from each other, the distances between the magnet arrays 33C and the magnet arrays 33A, 33B, and 33D are farther than those in the processing examples shown in FIGS. 4 to 6. Therefore, the magnetic field interference can be more reliably suppressed, and the variation in the voltage applied to the magnet array 33C can be more reliably suppressed.

The magnetron sputtering apparatus 1A can be used even in the case of performing processing using the semi-synchronous reciprocation as described in FIGS. 7 and 8 and in the case of performing processing in a state where the magnet array corresponding to the target to which the power is not supplied is stopped as described in FIG. 9. In that case, the processing may be performed in a state where the magnet array corresponding to the target to which the power is supplied is located at the processing position and the magnet array corresponding to the target to which the power is not supplied is located at their retreat positions.

Although the example of performing processing by selecting one of the electrode forming plates 32A to 32D of the sputtering mechanisms 3A to 3D and supplying the power thereto has been described, it is also possible to perform processing by selecting multiple electrode forming plates and supplying the power thereto. In the example shown in FIG. 14, the processing is performed by supplying the power to the electrode forming plates 32C and 32D in a state where the full synchronous reciprocation is performed. Therefore, both the targets 31C and 31D are sputtered, and an alloy film made of the materials constituting the targets 31C and 31D is formed on the wafer W. By performing the full synchronous reciprocation as described above, the magnet array 33C is prevented from getting close to another magnet array, and the magnet array 33D is also prevented from getting close to another magnet array. Therefore, the variation in the voltages applied to the electrode forming plates 32C and 32D is suppressed.

Figure 14:
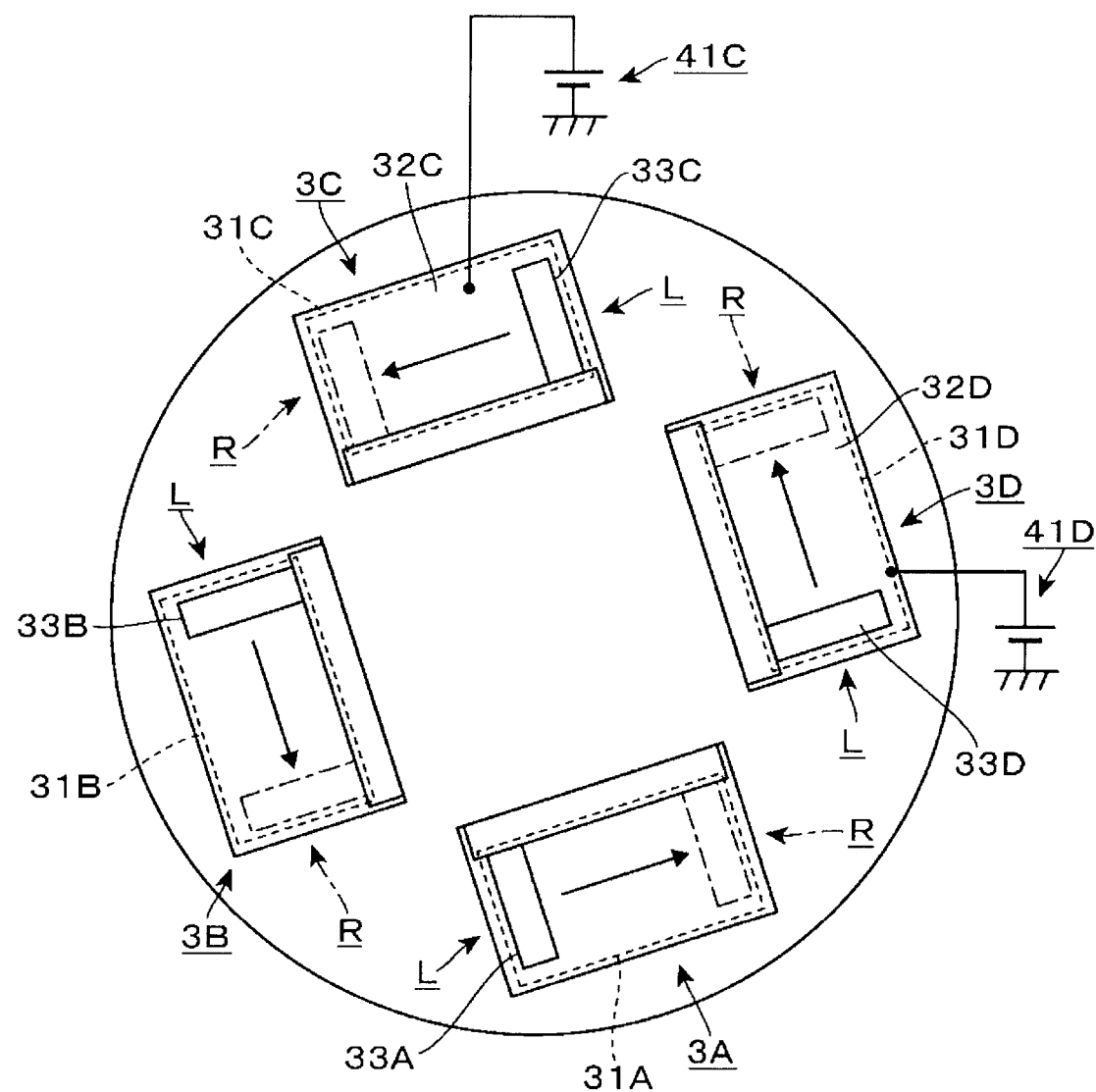
FIG. 14 is a longitudinal side view of the ceiling portion.

Since the full synchronous reciprocation prevents the magnet arrays 33A to 33D from getting close to each other, the combination of targets to which the power is supplied is not limited to the combination of the targets of the sputtering mechanisms adjacent in the circumferential direction as shown in FIG. 14. In other words, the power may be supplied to the target of any one of the sputtering mechanisms 3A to 3D and the targets of two sputtering mechanisms adjacent thereto. Further, the processing may be performed by supplying the power to targets of three sputtering mechanisms among the sputtering mechanisms 3A to 3D. A plurality of sputtering mechanisms may be selected to perform plasma processing.

Figure 15:
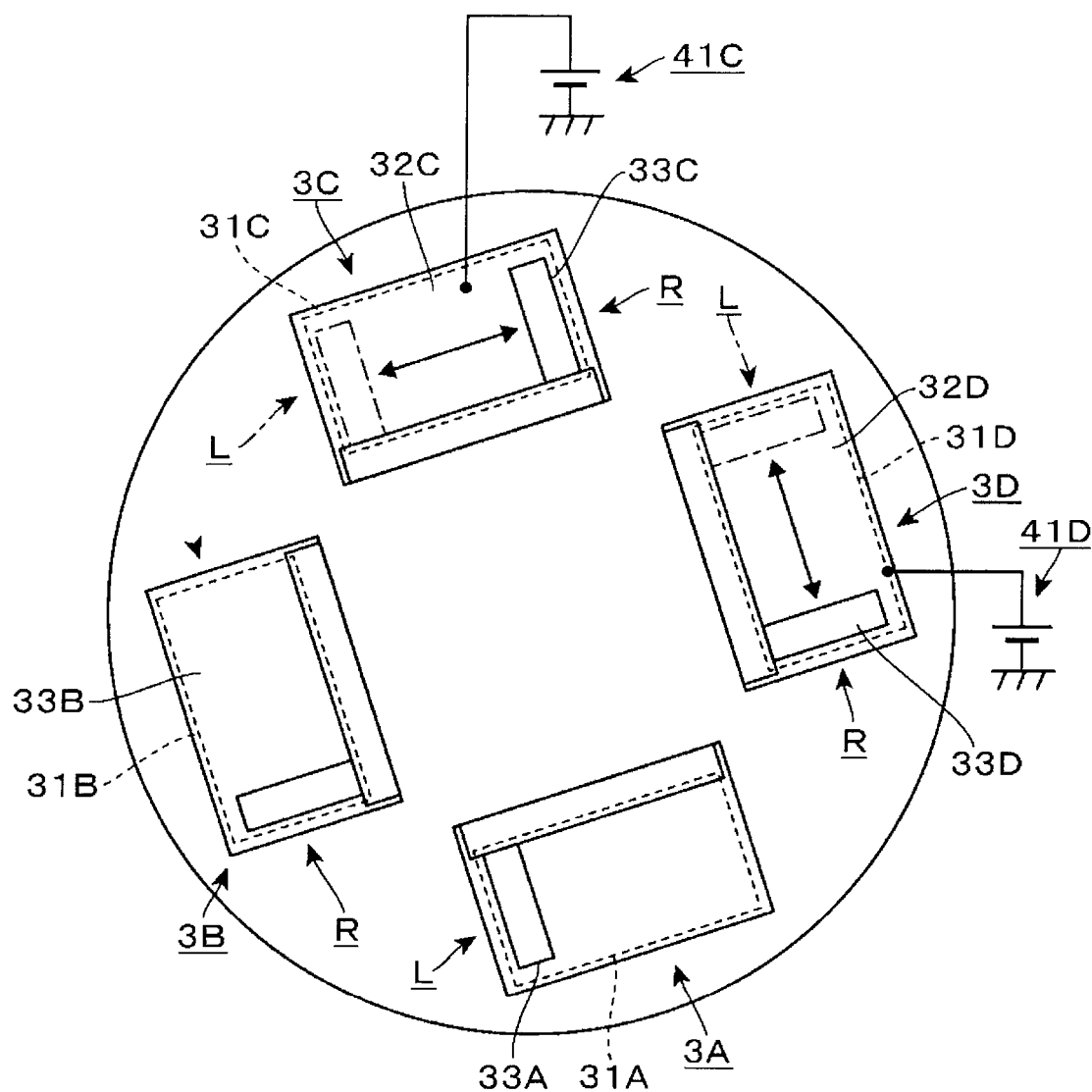
FIGS. 15 and 16 are top views showing modifications of the magnetron sputtering apparatus.

In the case of performing processing by supplying the power to the targets 31C and 31D, the magnet arrays 33C and 33D move synchronously toward the same position between the left position L and the right position R as shown in FIG. 15. On the other hand, the magnet array 33B may be stopped at the right position R to prevent the magnetic field interference with the magnet array 33C, and the magnet array 33A may be stopped at the left position L to prevent the magnetic field interference with the magnet array 33D. in the case of locating two sputtering mechanisms at the position farther from the selected sputtering mechanism between the left position L and the right position R, multiple sputtering mechanisms may be used as the selected sputtering mechanisms.

Figure 16:
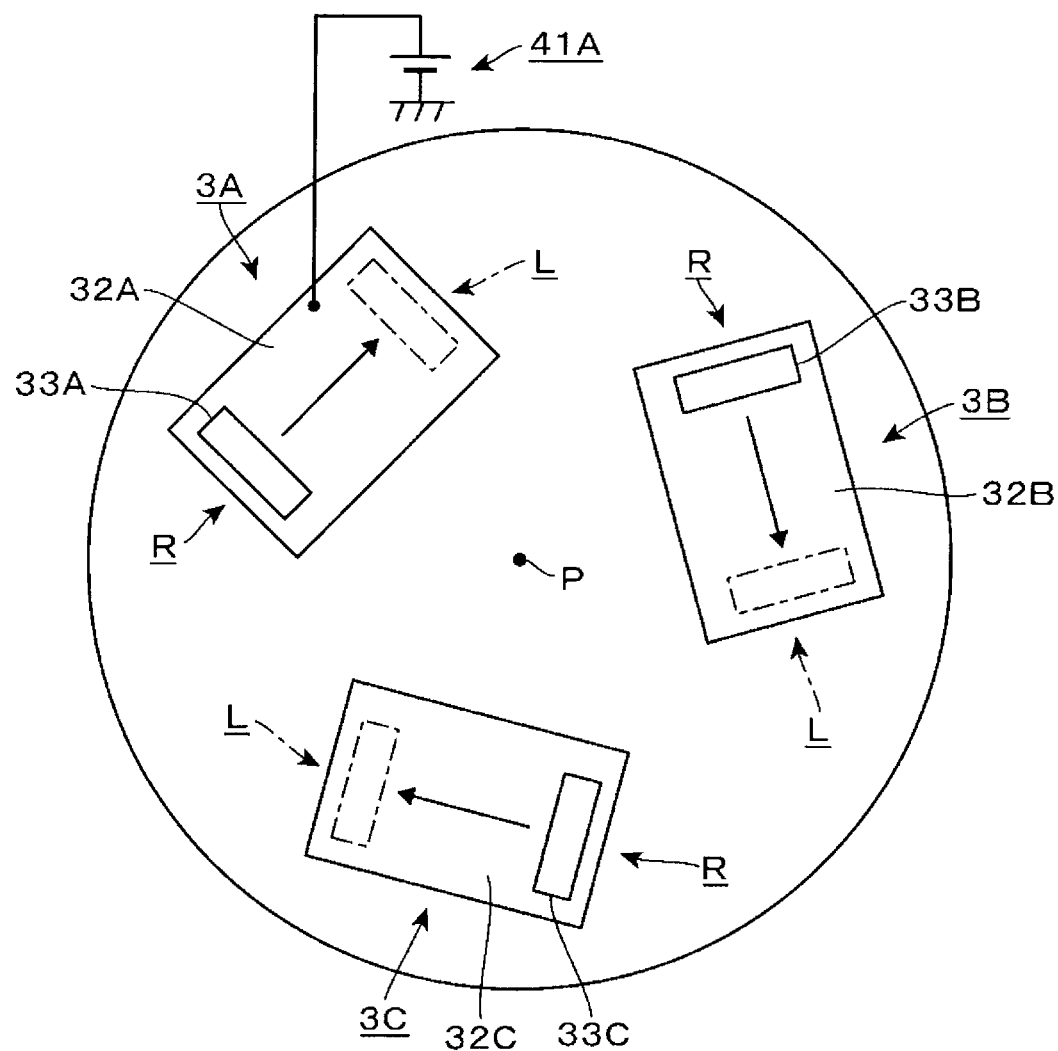
Figure 17:
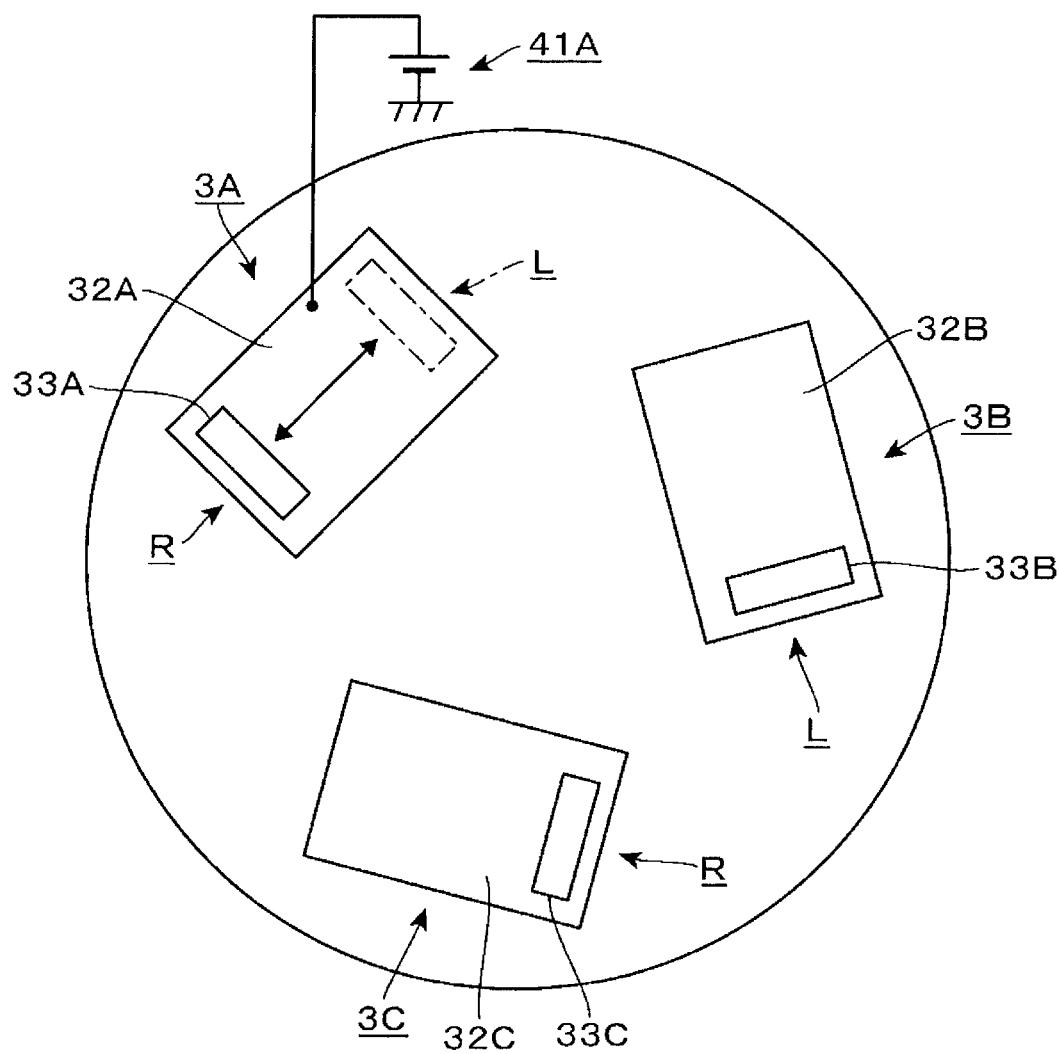
FIG. 17 is a top view of the magnetron sputtering apparatus showing operations of the magnetron sputtering apparatus in evaluation tests.

The number and layout of sputtering mechanisms are not limited to the above-described examples. For example, as shown in FIG. 16, three sputtering mechanisms 3A to 3C may be provided, each configured to reciprocate along one side of a triangle centered on the center P of the ceiling portion in plan view. Even when only three sputtering mechanisms are provided, the processing can be performed using the full synchronization reciprocation. FIG. 16 shows an example of performing processing by supplying the power to the electrode forming plate 32A. In the case of performing processing by supplying the power to the electrode forming plate 32A, the magnet arrays 33B and 33C corresponding to the other electrode forming plates 32B and 32C may be stopped at the left position L and the right position R, respectively, so as to get distant from the electrode forming plate 32A as shown in FIG. 17.

In addition, more than four sputtering mechanisms may be provided. Further, AC power supplies may be connected to the electrode forming plates 32A to 32D instead of the DC power supplies 41A to 41D, and plasma may be formed by applying an AC voltage. As long as an appropriate magnetic field can be formed, the arrangement of the magnet arrays 33A to 33D is not limited to the above-described ones, and the magnet arrays 33A to 33D may move along an arc other than linear paths. The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

Evaluation Tests

Evaluation tests related to the present disclosure will be described.

Evaluation Tests 1

In evaluation tests 1-1 to 1-3, in the magnetron sputtering apparatus 1, the power was supplied to the electrode forming plate 32C and the magnet array 33C reciprocated. In that state, the voltage applied to the electrode forming plate 32C was monitored. In the evaluation tests 1-1 to 1-3, the magnet arrays other than the magnet array 33C were operated differently.

In the evaluation test 1-1, the magnet arrays 33A, 33B, and 33D were stopped at their left positions L. Therefore, the magnet array 33B got close to the magnet array 33C. In the evaluation test 1-2, the semi-synchronous reciprocation of the magnet arrays 33A to 33D described in FIGS. 7 and 8 was performed. In the evaluation test 1-3, the full synchronous reciprocation described in FIGS. 4 to 6 was performed.

Figure 18:
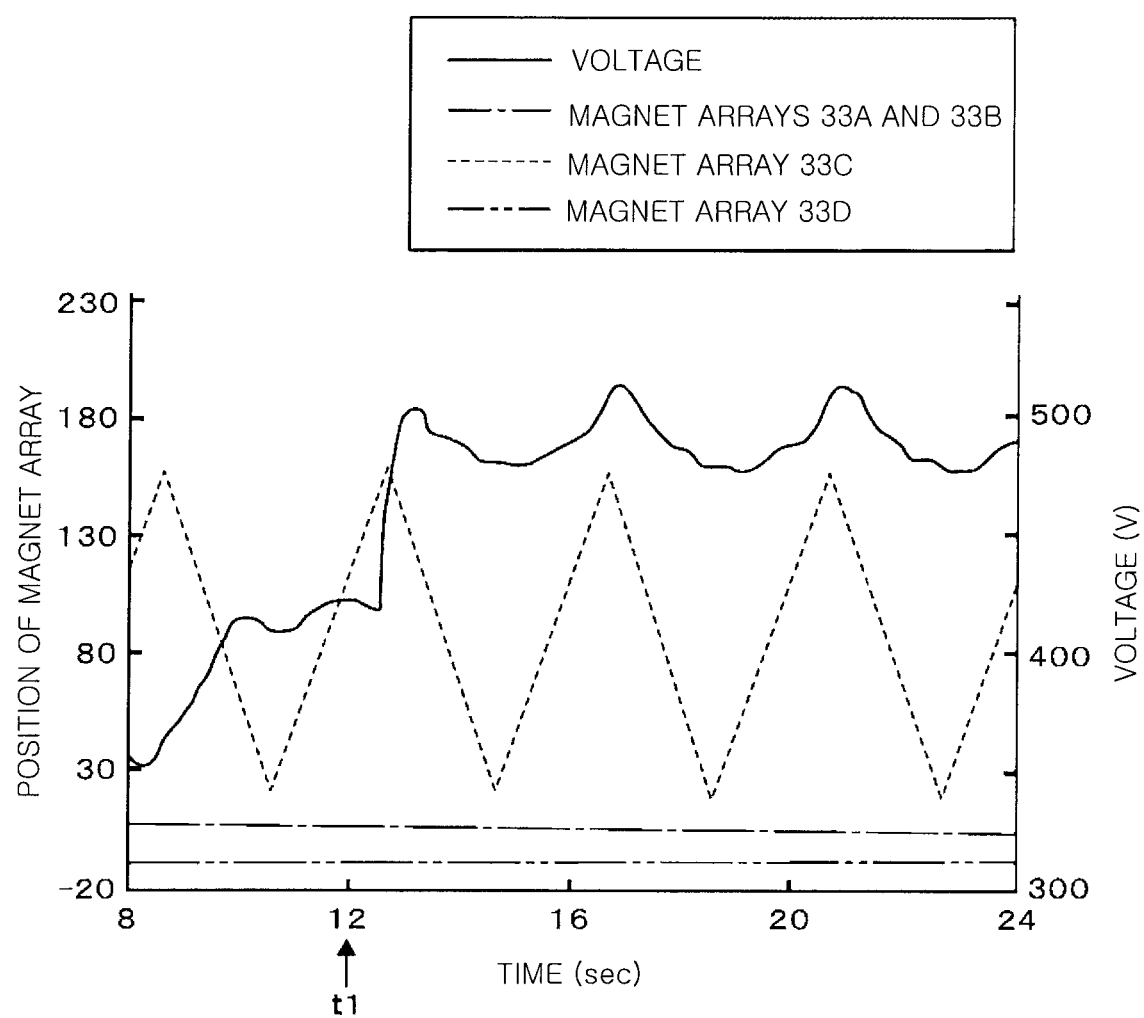
FIGS. 18 to 20 are graphs showing results of the evaluation tests.
Figure 19:
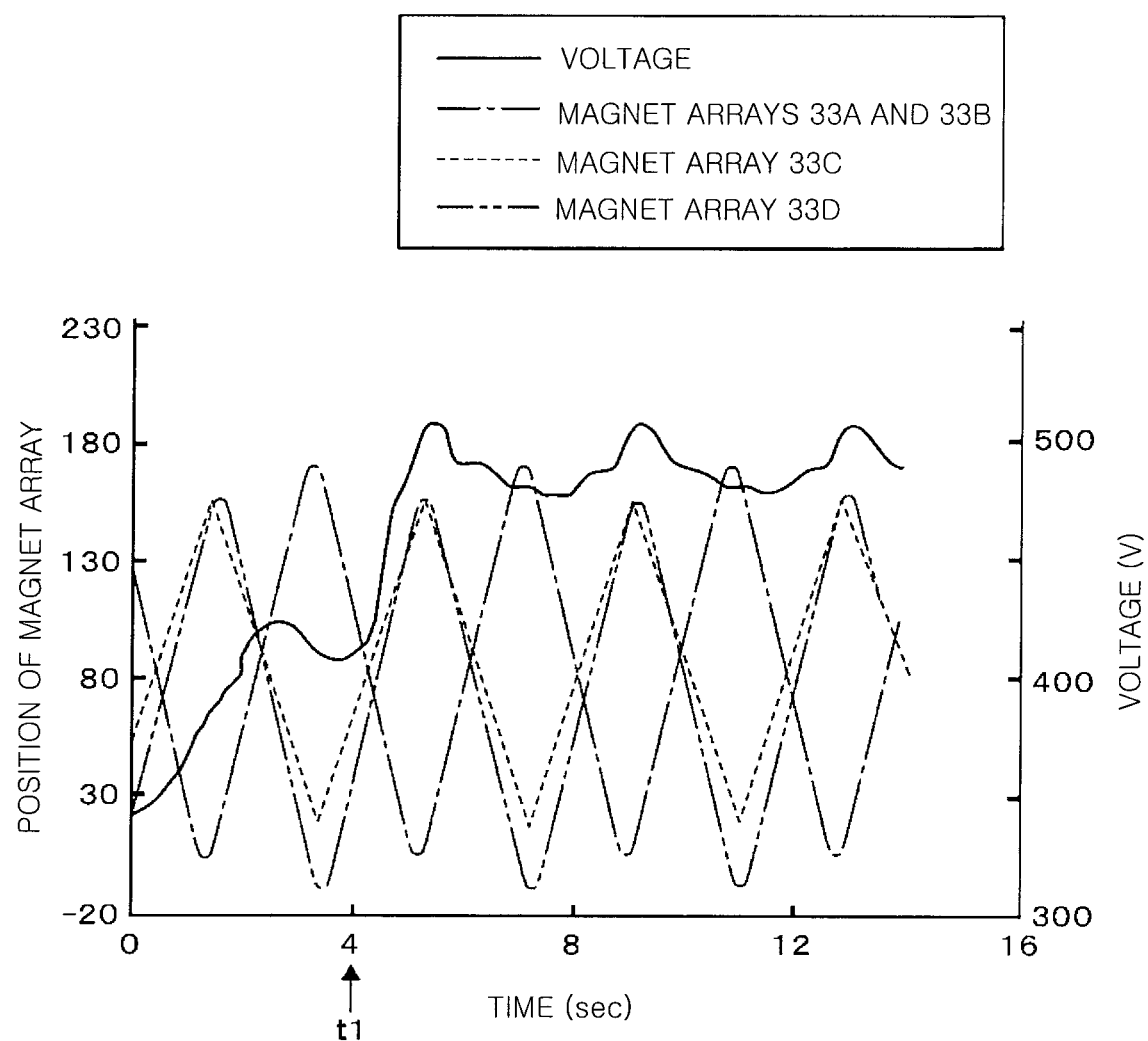
Figure 20:
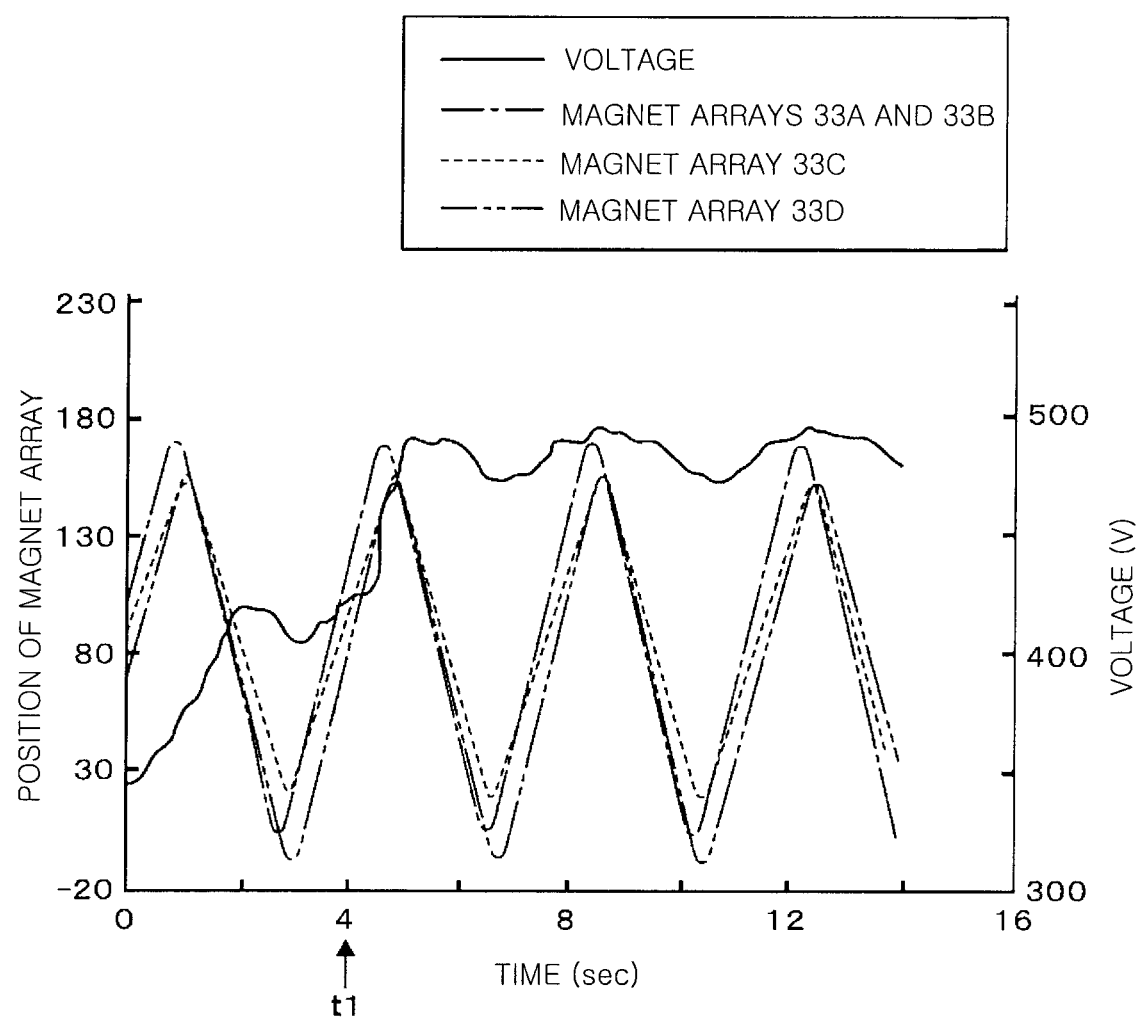

FIGS. 18, 19, and 20 are graphs showing the results of the evaluation tests 1-1, 1-2, and 1-3, respectively. The horizontal axis of the graph shows the elapsed time from the start of the test. Although not shown, a shutter (not shown) for partitioning the stage 14 and the ceiling portion of the vacuum chamber 11 is provided in the vacuum chamber 11. Time t1 indicates a timing at which the shutter is opened and a film can be formed on the wafer W. The vertical axis of the graph shows the position of the magnet array and the voltage (unit: V) applied to the target 31C. The positions of the magnet arrays 33A to 33D get closer to the right position R as the value on the vertical axis increases. Since the magnet arrays 33A and 33B reciprocate in the same manner in the evaluation tests 1-1 to 1-3, the positions thereof are indicated by common graph lines in the drawings.

In the evaluation tests 1-1 to 1-3, the maximum value and the minimum value of the voltage were detected after the rapid increase of the voltage was stopped after the time t1 and the voltage became relatively stable. In the evaluation test 1-1, the maximum value and the minimum value of the voltage are 512V and 476V, respectively, and, thus, the difference therebetween is 36V. In the evaluation test 1-2, the maximum value and the minimum value of the voltage are 510V and 479V, respectively, and, thus, the difference therebetween is 31V. In the evaluation test 1-3, the maximum value and the minimum value of the voltage are 498V and 472V, respectively, and, thus, the difference therebetween is 26V.

The maximum value of the voltage and the difference between the maximum value and the minimum value of the voltage were more suppressed in the evaluation test 1-2 of the semi-synchronous reciprocation and the evaluation test 1-3 of the full synchronous reciprocation than in the evaluation test 1-1. Further, the maximum value of the voltage and the difference between the maximum value and the minimum value of the voltage were more suppressed in the evaluation test 1-3 than in the evaluation test 1-2. Therefore, the results of the evaluation tests show that it is possible to suppress the variation in the voltage applied to form the plasma and to reduce the maximum value of the voltage by preventing the distance between the magnet arrays from getting decreased. The results of the evaluation tests also show that the degree of voltage variation changes depending on the degree of magnetic field interference caused by the decrease in the distance between the magnet arrays. Moreover, it is effective to perform the full synchronous reciprocation of the magnet arrays 33A to 33D described in FIGS. 4 to 6 or the semi-synchronous reciprocation of the magnet arrays 33A to 33D described in FIGS. 7 and 8, and it is more effective to perform the full synchronous reciprocation of the magnet arrays 33A to 33D.

Evaluation Tests 2

In the evaluation tests 2-1 to 2-4, the magnet arrays 33A and 33C are stopped at their left positions L, and different combinations of the arrangements of the magnet arrays 33B and 33D were used for the evaluation tests 2-1 to 2-4. Then, the power was supplied to the target 31C and the voltage was monitored. The magnet arrays 33B and 33D on both sides of the target 31C in the circumferential direction were located differently in the evaluation tests 2-1 and 2-4. In the evaluation test 2-1, both the magnet arrays 33B and 33D were located at their left positions L. In the evaluation test 2-2, the magnet arrays 33B and 33D were located at the left position L and the right position R, respectively. In the evaluation test 2-3, the magnet arrays 33B and 33D were located at the right position R and the left position L, respectively. Therefore, the arrangement of the magnet arrays 33B and 33D in the evaluation test 2-3 is the same as that shown in FIG. 9. In the evaluation test 2-4, both the magnet arrays 33B and 33D were located at their right positions R. In the evaluation tests 2-1 to 2-4, Ar gas was supplied into the vacuum chamber 11 at a flow rate of 18 sccm. The materials of the targets 31A to 31D are different from those described in the embodiment. The target 31A is made of molybdenum. The targets 31B and 31C are made of CoFeB. The target 31D is made of CoFe. The content of Co is different in the targets 31B and 31C.

In the evaluation test 2-1, the maximum value, the minimum value, and the average value of the monitored voltage were 793V, 649V, and 716V, respectively. In the evaluation test 2-2, the maximum value, the minimum value, and the average value of the monitored voltage were 809V, 654V, and 727V, respectively. In the evaluation test 2-3, the maximum value, the minimum value, and the average value of the monitored voltage were 790V, 650V, and 720V, respectively. In the evaluation test 2-4, the maximum value, the minimum value, and the average value of the monitored voltage were 800V, 658V, and 730V, respectively. In the evaluation tests 2-2 and 2-4 in which the magnet array 33D gets close to the magnet array 33C, the respective voltage values are relatively high. In the evaluation tests 2-1 and 2-3 in which the magnet array 33D is kept relatively distant from the magnet array 33C, the respective voltage values are lower in the evaluation test 2-3 in which the magnet array 33B is farther from the magnet array 33C.

The results of the evaluation tests 2 show that the voltage variation can be suppressed and the maximum voltage can be lowered by locating the magnet arrays adjacent in the circumferential direction to the magnet array corresponding to the target to which the voltage is applied so as to get distant from the magnet array corresponding to the target to which the voltage is applied. This may be because the magnetic field interference between the magnet arrays is weakened by such as described above.

The results of the evaluation tests 2 shows that it is effective to arrange the magnet arrays as described in FIG. 9.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A magnetron sputtering apparatus comprising:
a vacuum chamber storing a substrate;
a plurality of sputtering mechanisms, each including a target having one surface facing inside of the vacuum chamber, a magnet array, and a moving mechanism configured to reciprocate the magnet array between a first position and a second position along a linear path on the other surface of the target in order to sputter the target;
a power supply configured to form plasma by supplying power to a target of each of selected sputtering mechanisms among the plurality of sputtering mechanisms so that the selected sputtering mechanisms perform film formation on the substrate, the other sputtering mechanisms being unselected sputtering mechanisms;
a gas supplier configured to supply a gas for plasma formation into the vacuum chamber; and
a controller configured to output a control signal, in performing the film formation, such that each of magnet arrays of at least two unselected sputtering mechanisms is stopped at a position distant from a selected sputtering mechanism between the first position and the second position, wherein extension lines from moving paths of the magnet arrays of said at least two unselected sputtering mechanisms intersect an extension line from a moving path of a magnet array of said selected sputtering mechanism in plan view, wherein the position distant from the selected sputtering mechanism is a position farther from the selected sputtering mechanism between the first position and the second position.

2. The magnetron sputtering apparatus of claim 1, wherein the controller is configured to further output the control signal, in performing the film formation, such that a magnet array of a selected sputtering mechanism and a magnet array of an unselected sputtering mechanism, wherein extension lines of moving paths of said magnet arrays intersect each other in plan view, move synchronously so as to be distant from each other.

3. The magnetron sputtering apparatus of claim 2, wherein the number of the plurality of sputtering mechanisms is three or more, and
two or more sputtering mechanisms are selected for the film formation.

4. The magnetron sputtering apparatus of claim 2, wherein the plurality of sputtering mechanisms are arranged at a ceiling portion of the vacuum chamber in a circumferential direction of the vacuum chamber, and
the film formation is performed with sputtering mechanisms adjacent in the circumferential direction, wherein extension lines of the magnet arrays of the adjacent sputtering mechanisms intersect each other in plan view, one of the adjacent sputtering mechanisms is used as the selected sputtering mechanism, and the others of the adjacent sputtering mechanisms are used as the unselected sputtering mechanisms.

5. The magnetron sputtering apparatus of claim 4, wherein four sputtering mechanisms are arranged in the circumferential direction of the vacuum chamber, and
when the sputtering mechanisms adjacent in the circumferential direction in plan view are set as a pair, the extension lines of the moving paths of the magnet arrays in any pair intersect each other, and the controller is configured to further output the control signal such that the magnet arrays thereof move synchronously to be distant from each other.

6. The magnetron sputtering apparatus of claim 1, wherein the controller is further configured to output the control signal such that each of magnet arrays of at least two unselected sputtering mechanisms is stopped at a location farther from the position farther from the selected sputtering mechanism between the first position and the second position.

7. The magnetron sputtering apparatus of claim 1, wherein each of the plurality of sputtering mechanisms includes an elevating mechanism for raising and lowering the magnet array between a first height position and a second height position, the second height position being farther from the target than the first height position is, and the magnet array of the selected sputtering mechanism reciprocates at the first height position, and the magnet array of the unselected sputtering mechanism reciprocates at the second height position.

8. A magnetron sputtering method comprising:

storing a substrate in a vacuum chamber;

reciprocating magnet arrays, by a plurality of sputtering mechanisms, each including a target having one surface facing the vacuum chamber, a magnet array, and a moving mechanism, between a first position and a second position along a linear path on the other surface of the target in order to sputter the target, moving directions of the magnet arrays intersecting one another;

forming plasma by supplying power from a power supply to a target of each of selected sputtering mechanisms among the plurality of sputtering mechanisms so that the selected sputtering mechanisms perform film formation on the substrate, the other sputtering mechanisms being unselected sputtering mechanisms;

supplying a gas for plasma formation into the vacuum chamber by a gas supplier; and for the film formation, stopping each of magnet arrays of at least two unselected sputtering mechanisms at a position distant from a selected sputtering mechanism between the first position and the second position, wherein extension lines from moving paths of the magnet arrays of said at least two unselected sputtering mechanisms intersect an extension line from a moving path of a magnet array of said selected sputtering mechanism in plan view, wherein the position distant from the selected sputtering mechanism is a position farther from the selected sputtering mechanism between the first position and the second position.

* * * * *